United States Patent
Chang et al.

(10) Patent No.: US 12,217,971 B2
(45) Date of Patent: Feb. 4, 2025

(54) METHOD FOR FORMING SEMICONDUCTOR DEVICE

(71) Applicant: TAIWAN SEMICONDUCTOR MANUFACTURING COMPANY, LTD., Hsinchu (TW)

(72) Inventors: Ching-Yu Chang, Taipei (TW); Jei-Ming Chen, Tainan (TW); Tze-Liang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 628 days.

(21) Appl. No.: 17/391,660

(22) Filed: Aug. 2, 2021

(65) Prior Publication Data

US 2022/0319862 A1   Oct. 6, 2022

Related U.S. Application Data

(60) Provisional application No. 63/168,764, filed on Mar. 31, 2021.

(51) Int. Cl.
| | |
|---|---|
| *H01L 21/311* | (2006.01) |
| *H01L 21/033* | (2006.01) |
| *H01L 21/768* | (2006.01) |
| *H01L 23/528* | (2006.01) |

(Continued)

(52) U.S. Cl.
CPC .... *H01L 21/31144* (2013.01); *H01L 21/0332* (2013.01); *H01L 21/0337* (2013.01); *H01L 21/76816* (2013.01); *H01L 23/528* (2013.01); *H01L 21/02186* (2013.01); *H01L 21/76802* (2013.01); *H01L 21/823475* (2013.01)

(58) Field of Classification Search
CPC ........... H01L 21/31144; H01L 21/0332; H01L 21/0337; H01L 21/76816; H01L 23/528; H01L 21/02186; H01L 21/02274; H01L 21/0228; H01L 21/76802; H01L 21/823475

See application file for complete search history.

(56) References Cited

U.S. PATENT DOCUMENTS

| | | | | |
|---|---|---|---|---|
| 2015/0318283 A1* | 11/2015 | Bayram | ............. | H01L 27/1207 257/369 |
| 2019/0006227 A1* | 1/2019 | Tsai | ................. | H01L 21/76224 |
| 2019/0067087 A1* | 2/2019 | Briggs | ............. | H01L 21/76831 |

(Continued)

*Primary Examiner* — Ratisha Mehta
*Assistant Examiner* — Brad A Knudson
(74) *Attorney, Agent, or Firm* — Birch, Stewart, Kolasch & Birch, LLP

(57) ABSTRACT

A method includes forming a dielectric layer over a substrate; forming a patterned amorphous silicon layer over a dielectric layer; depositing a first spacer layer over the patterned amorphous silicon layer; depositing a second spacer layer over the first spacer layer; forming a photoresist having an opening over the substrate; depositing a hard mask layer in the opening of the photoresist; after depositing the hard mask layer in the opening of the photoresist, removing the photoresist; and performing an etching process to etch the dielectric layer by using the patterned amorphous silicon layer, the first spacer layer, the second spacer layer, and the hard mask layer as an etch mask, in which the etching process etches the second spacer layer at a slower etch rate than etching the first spacer layer.

20 Claims, 35 Drawing Sheets

(51) Int. Cl.
*H01L 21/02* (2006.01)
*H01L 21/8234* (2006.01)

(56) References Cited

U.S. PATENT DOCUMENTS

2019/0148140 A1* 5/2019 Peethala ............. H01L 21/0228
  438/785
2020/0168500 A1* 5/2020 Lazzarino ........... H01L 21/7688

* cited by examiner

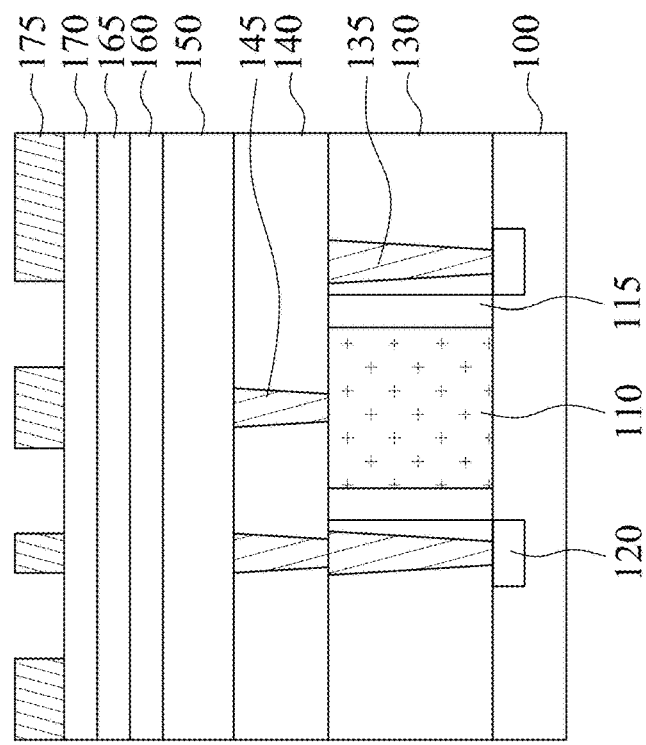
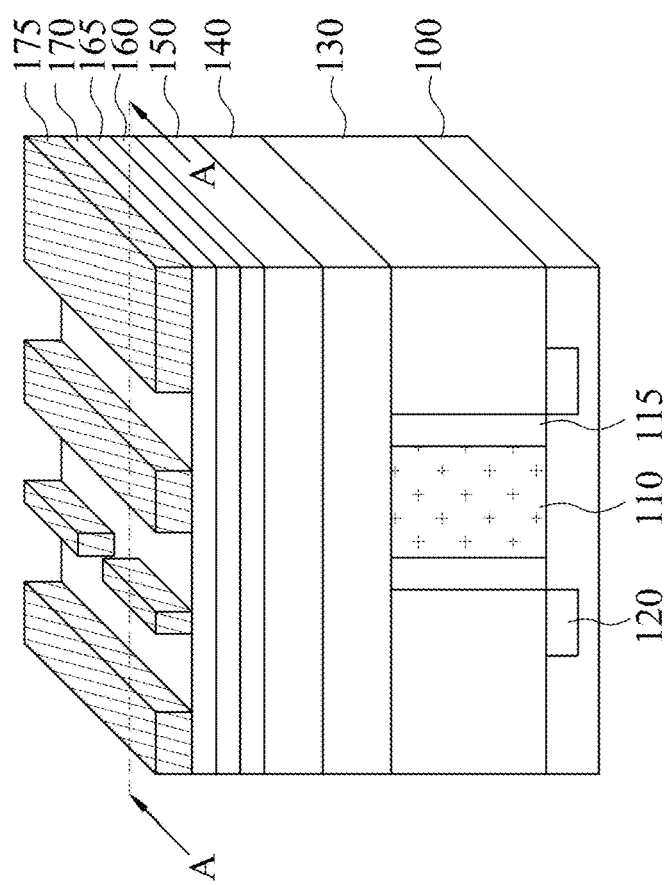

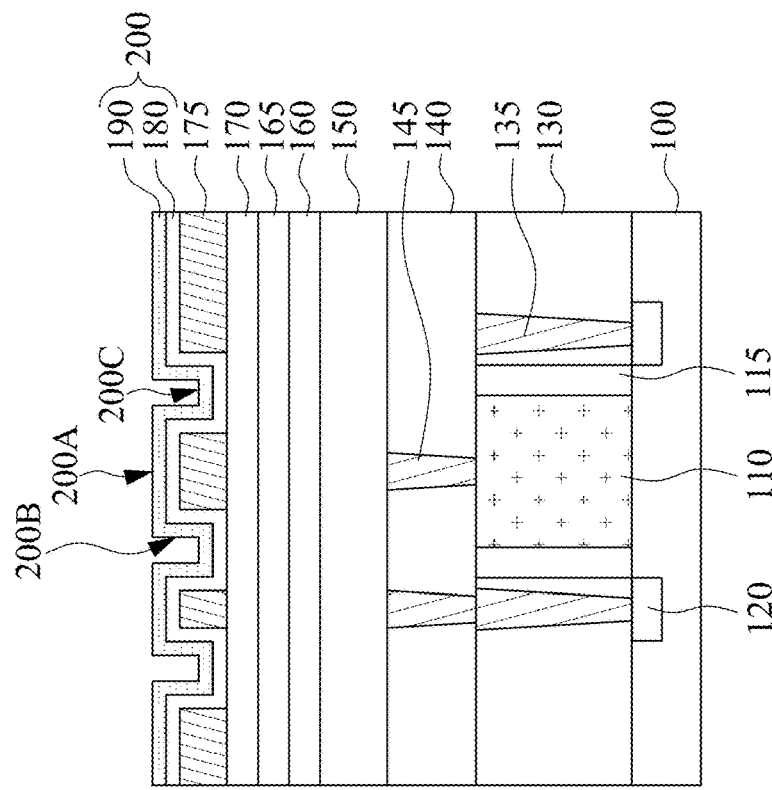
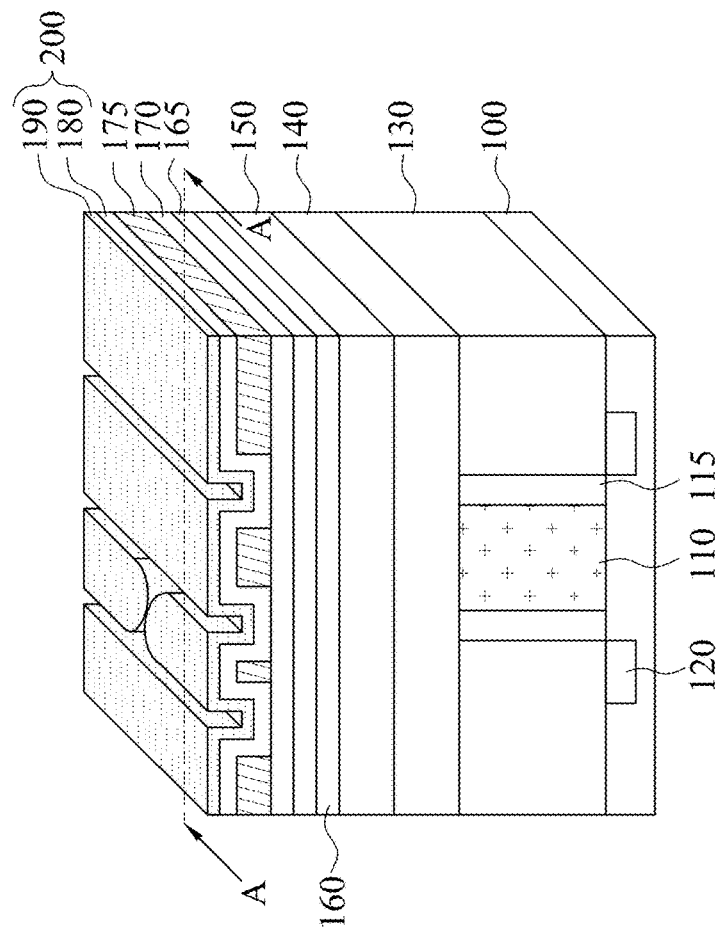
Fig. 3B
Fig. 3A

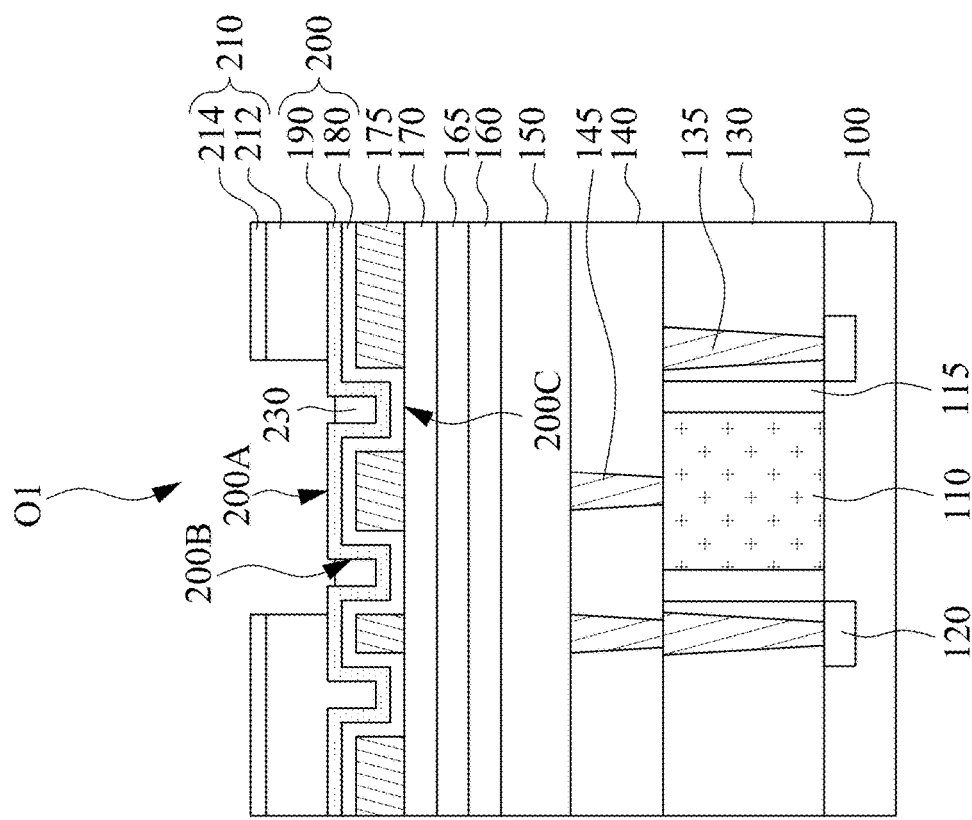
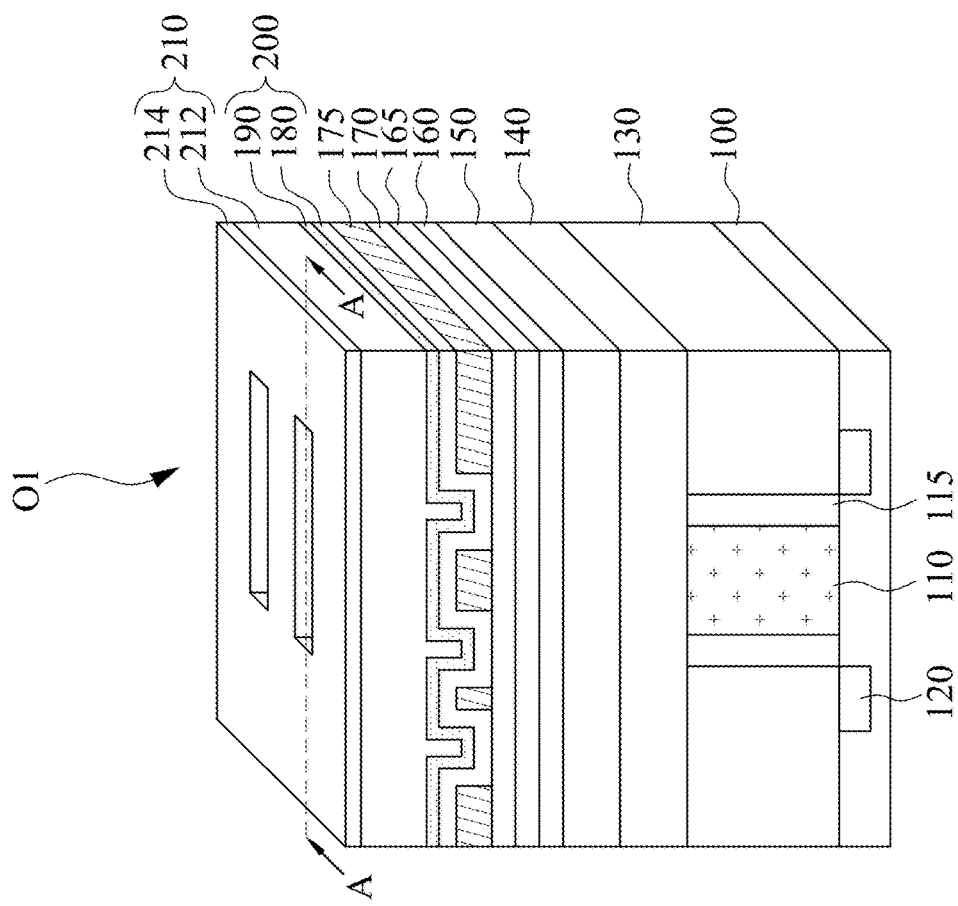

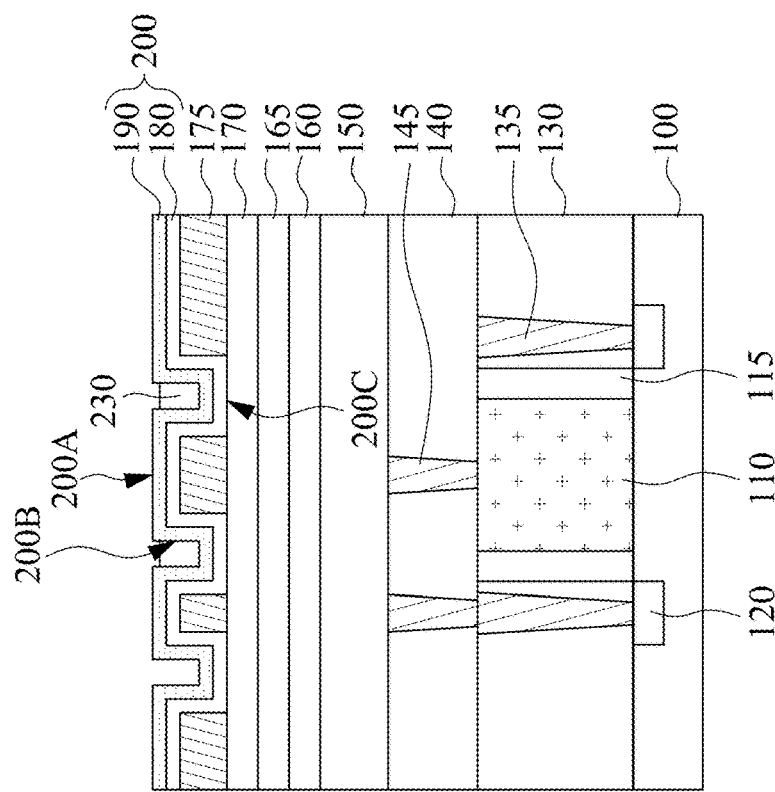
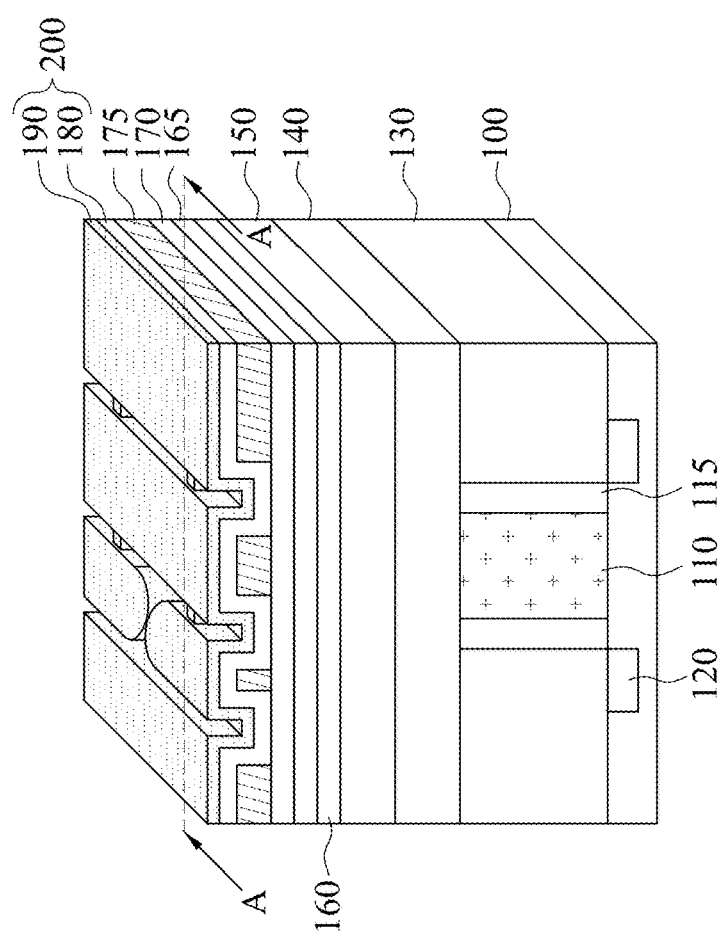
Fig. 9B
Fig. 9A

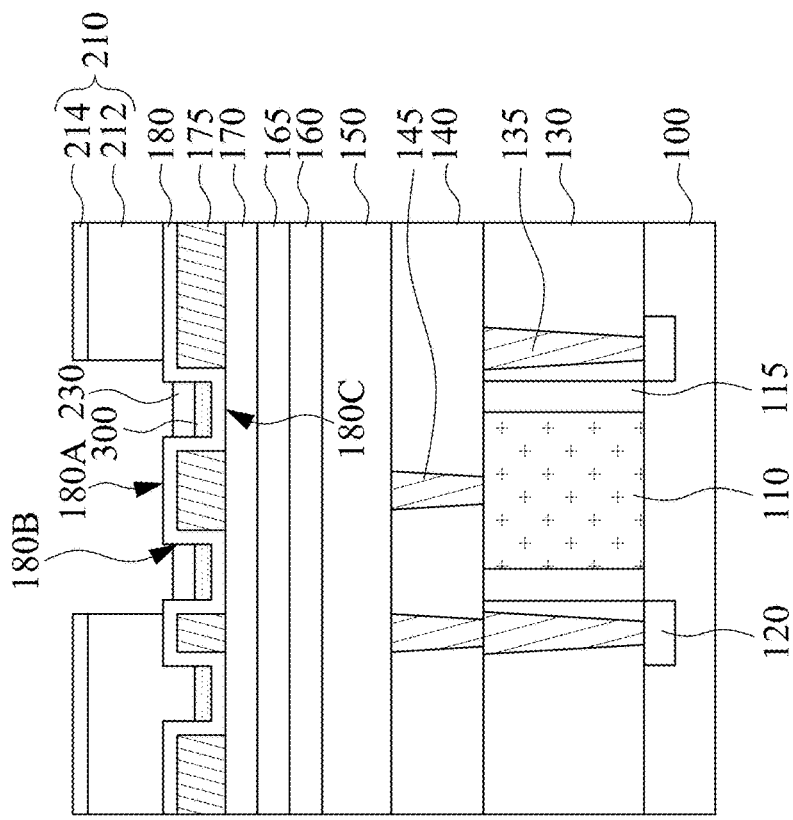
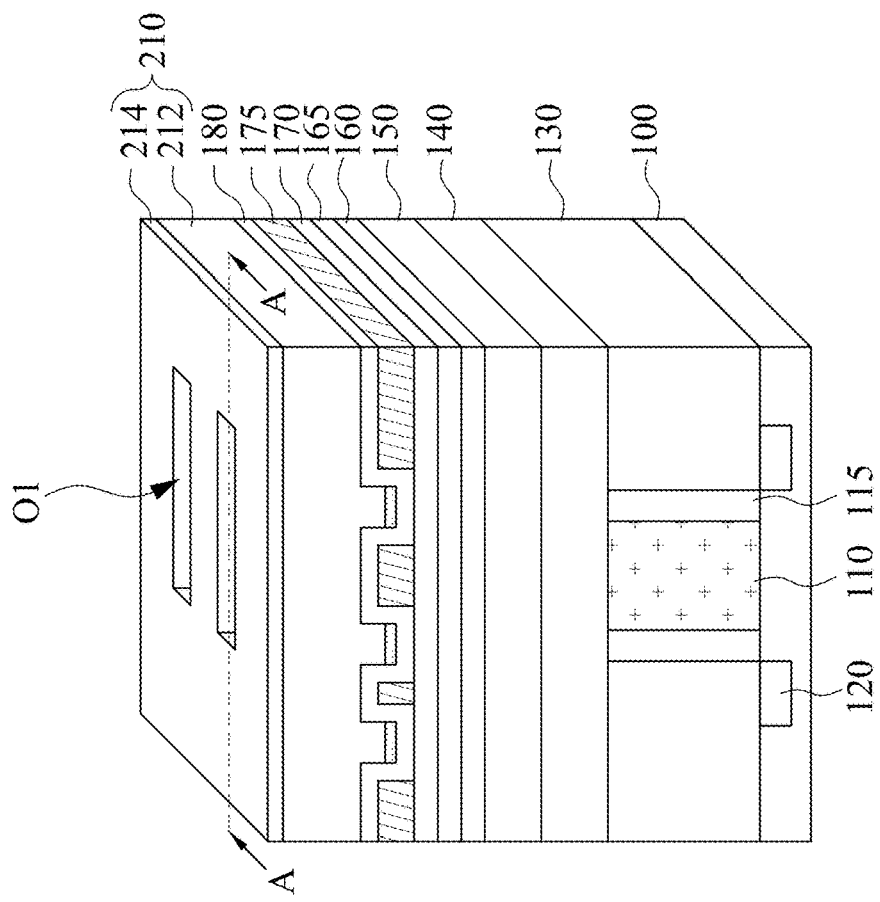
Fig. 21A
Fig. 21B

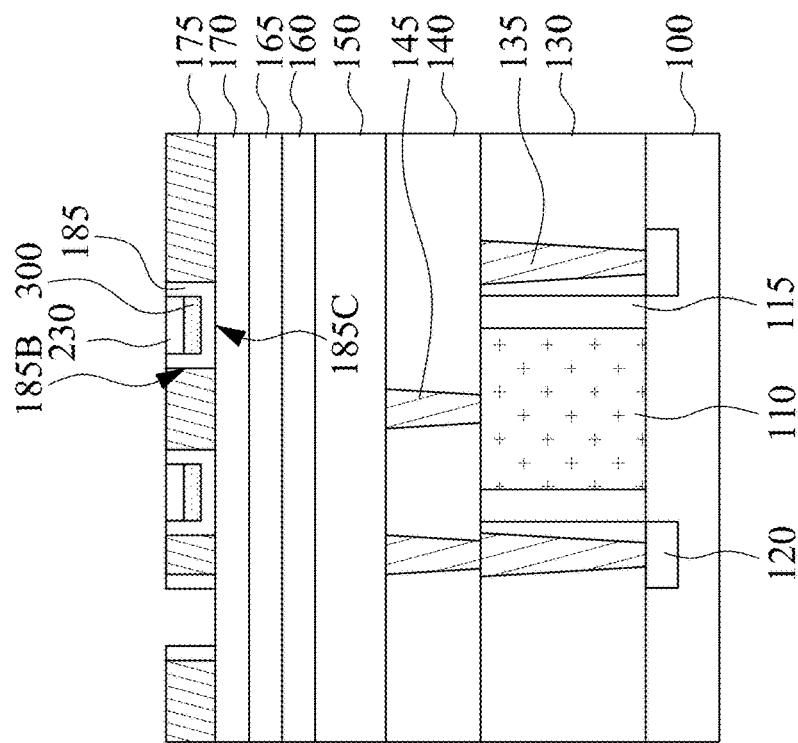
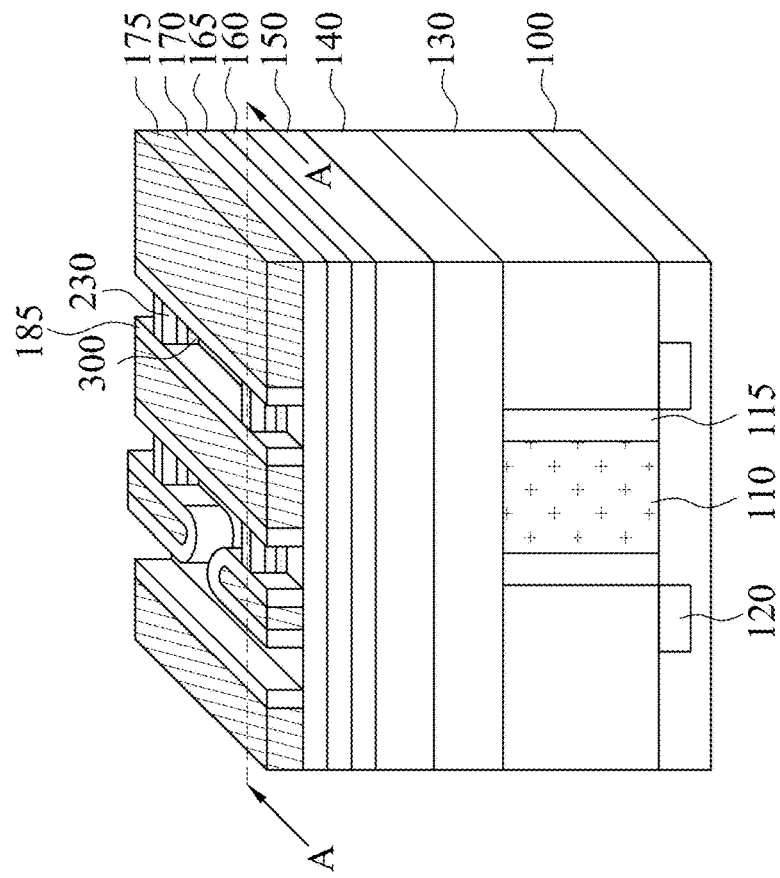
Fig. 23B
Fig. 23A

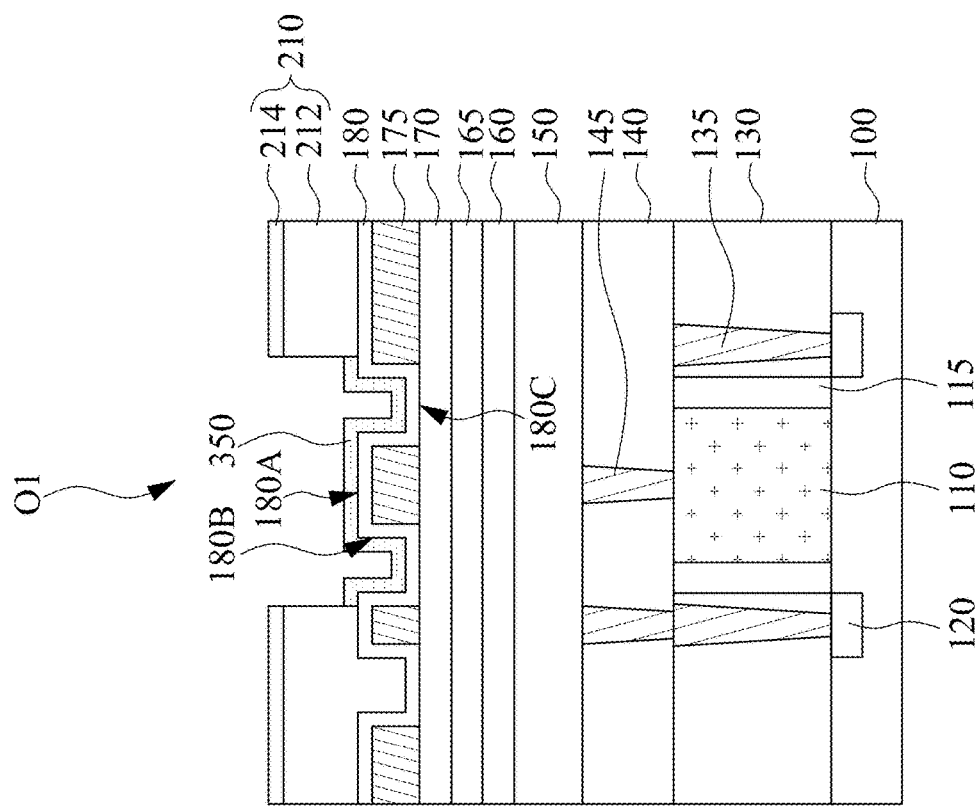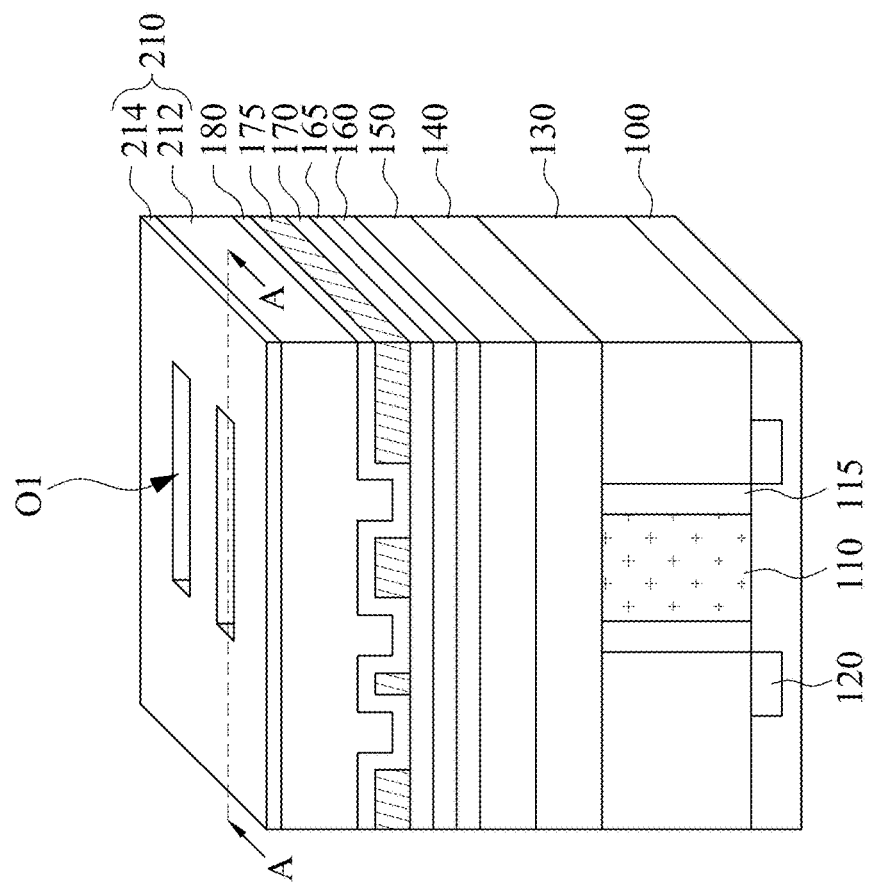
Fig. 28A
Fig. 28B

METHOD FOR FORMING SEMICONDUCTOR DEVICE

PRIORITY CLAIM AND CROSS-REFERENCE

The present application claims priority to U.S. Provisional Application Ser. No. 63/168,764, filed Mar. 31, 2021, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, a spacer technique is often used to form mandrels, which are used in devices such as a fin field effect transistor (FinFET) device. Frequently, the spacer technique is used for doubling the exposed pattern in advanced lithography. That is, the pitch of a final pattern is reduced to only half compared with the first exposed pattern. Due to constraints from the lithography process, it is difficult to obtain small cut features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 16B show various stages of a sequential manufacturing operation of a semiconductor device according to an embodiment of the present disclosure.

FIGS. 17A to 26B show various stages of a sequential manufacturing operation of a semiconductor device according to an embodiment of the present disclosure.

FIGS. 27A to 35B show various stages of a sequential manufacturing operation of a semiconductor device according to an embodiment of the present disclosure.

DETAILED DESCRIPTION

Figure 2B:
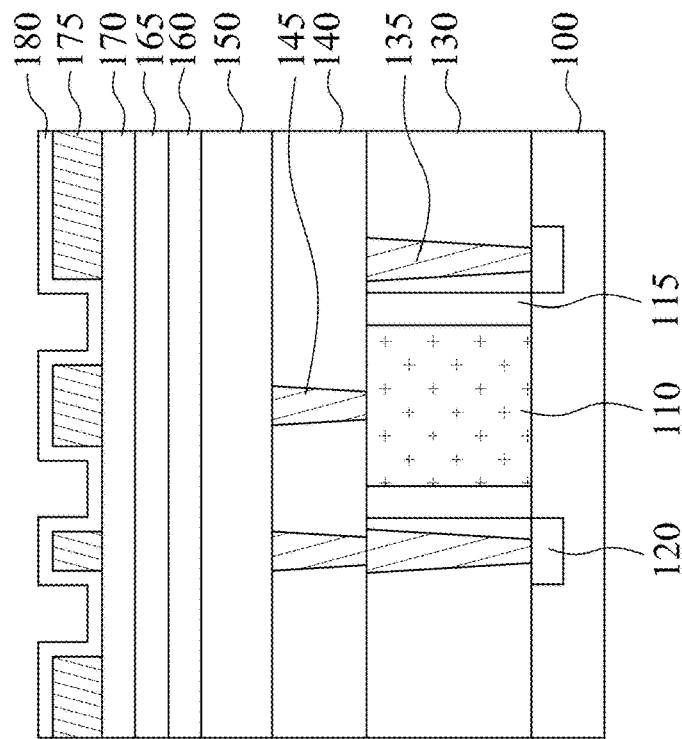

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 16B show various stages of a sequential manufacturing operation of a semiconductor device according to an embodiment of the present disclosure. It is understood that additional operations can be provided before, during, and after the processes shown by FIGS. 1A to 16B, and some of the operations described below can be replaced or eliminated, for additional embodiments of the method. Material, configuration, dimensions and/or processes the same as or similar to the foregoing embodiments described with FIGS. 1A to 16B may be employed in the following embodiments, and detailed explanation thereof may be omitted.

Reference is made to FIGS. 1A and 1B, in which FIG. 1B is a cross-sectional view along line A-A of FIG. 1A. Shown there is a substrate 100. In some embodiments, the substrate 100 includes a semiconductor substrate. The substrate 100 may include a crystalline silicon substrate or a doped semiconductor substrate (e.g., p-type semiconductor substrate or n-type semiconductor substrate). In some alternative embodiments, the substrate 100 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

A gate structure 110 is formed over the substrate 100. In some embodiments, the gate structure 110 may include a gate dielectric, a work function metal layer, and a filling metal. For example, the gate dielectric may be silicon oxide, and may include high-K dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material. The work function metal layer may be a p-type work function layers for p-type device, or an n-type work function layers for n-type device. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, TiN, Ag, TaAl, TaAlC, TiAlN, TaC, TaCN, TaSiN, Mn, Zr, other suitable n-type work function materials, or combinations thereof. The work function metal layer may include a plurality of layers. In some embodiments, the filling metal may include tungsten (W). In some other embodiments, the gate electrode includes aluminum (Al), copper (Cu) or other suitable conductive material. In some other embodiments, the gate structure 110 may include a gate dielectric and a gate electrode. For example, the gate dielectric may be silicon oxide, and the gate electrode may be a conductive and may be selected from a group including polycrystalline-silicon (polysilicon), poly-crystalline silicon-germanium (poly-SiGe), metallic nitrides, metallic silicides, metallic oxides, and metals.

Gate spacers 115 are formed on opposite sidewalls of the gate structure 110. In some embodiments, the gate spacers 115 may be formed of silicon oxide, silicon nitride, silicon oxynitride, combinations thereof, using techniques such as thermal oxidation or deposited by CVD, ALD, or the like.

Source/drain regions 120 may be formed as doped regions in the substrate 100 and on opposite sides of the gate structures 110. In some embodiments, the source/drain regions 120 may include Ge, Si, GaAs, AlGaAs, SiGe, GaAsP, SiP, or other suitable material, and may be doped with N-type dopants or P-type dopants. In some embodiments, the source/drain regions 120 are epitaxially grown over there substrate 100, and may also be referred to as source/drain epitaxial structures. In some embodiments, the gate structure 110 and the source/drain regions 120 on opposite sides of the gate structure 110 may form a transistor.

An interlayer dielectric (ILD) layer 130 may be formed over the substrate 100. In some embodiments, the ILD layer 130 may include silicon oxide, silicon nitride, silicon oxynitride, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 130 may be formed by suitable deposition process, such as CVD, PVD, ALD, or the like.

Source/drain contacts 135 are formed in the ILD layer 130 and are electrically connected to the source/drain regions 120. In some embodiments, the source/drain contacts 135 may include Ti, W, Co, Cu, Al, Mo, MoW, W, TiN, TaN, WN, combinations thereof, or other suitable conductive material.

An interlayer dielectric (ILD) layer 140 may be formed over the ILD layer 130. In some embodiments, the ILD layer 140 may include silicon oxide, silicon nitride, silicon oxynitride, phosphosilicate glass (PSG), borophosphosilicate glass (BPSG), low-k dielectric material, and/or other suitable dielectric materials, Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 140 may be formed by suitable deposition process, such as CVD, PVD, ALD, or the like.

Via plugs 145 are formed in the ILD layer 140, and may be formed in contact with the gate structure 110, and may be formed in contact with at least one of the source/drain contacts 135. In some embodiments, the via plugs 145 may include Ti, W, Co, Cu, Al, Mo, MoW, W, TiN, TaN, WN, combinations thereof, or other suitable conductive material. In some embodiments, the via plug 145 over the gate structure 110 can be referred to as a gate contact, and the via plugs 145 over the source/drain contacts 135 can be referred to as source/drain vias.

An interlayer dielectric (ILD) layer 150 may be formed over the ILD layer 140. In some embodiments, the ILD layer 150 may include silicon oxide, silicon nitride, silicon oxynitride, phosphosilicate glass (PSG), borophosphosilicate glass (BPSG), low-k dielectric material, and/or other suitable dielectric materials, Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 150 may include extreme low-k dielectric (ELK) material. In some embodiments, the ILD layer 150 may be formed by suitable deposition process, such as CVD, PVD, ALD, or the like.

An anti-reflective coating (ARC) layer 160 is formed over the ILD layer 150. In some embodiments, the ARC layer 160 may be a nitrogen-free anti-reflection coating (NFARC) layer, and may also be referred to as a NFARC layer 160. In some embodiments, the NFARC layer 160 may include a material such as silicon oxide, silicon oxygen carbide, or plasma enhanced chemical vapor deposited silicon oxide. In some embodiments, the ARC 160 may be formed by suitable deposition process, such as CVD, PVD, ALD, or the like. In some embodiments, the ARC layer 160 may also be referred to as a dielectric layer.

A titanium nitride (TiN) layer 165 is then formed over the ARC layer 160. The titanium nitride layer 165 is formed by a radio-frequency physical vapor deposition (RFPVD) process in the some embodiments, or may be formed by an alternative processes in other embodiments. In some embodiments, the titanium nitride layer 165 may also be referred to as a conductive layer.

A tetraethyl orthosilicate (TEOS) layer 170 is then formed over the titanium nitride layer 165. In some embodiments, the TEOS layer 170 is formed by a process such as PVD, CVD, plasma enhanced chemical vapor deposition (PECVD), combinations thereof, or another suitable technique. In some embodiments, the TEOS layer 170 may also be referred to as a dielectric layer.

An amorphous silicon layer 175 is then formed over the TEOS layer 170. The amorphous silicon layer 175 is formed by a process such as PVD, CVD, sputtering, or another suitable technique. The amorphous silicon layer 175 herein may serve as a mask layer to be patterned by a photoresist layer (discussed below). In other embodiments, a mask layer of another suitable material may be used instead of the amorphous silicon layer 175. In some embodiments, the amorphous silicon layer 175 may be patterned according to a predetermined pattern. Accordingly, as shown in FIGS. 1A and 1B, portions of top surfaces of the TEOS layer 170 are covered by the amorphous silicon layer 175, and portions of the top surfaces of the TEOS layer 170 are exposed by the amorphous silicon layer 175.

Figure 2A:
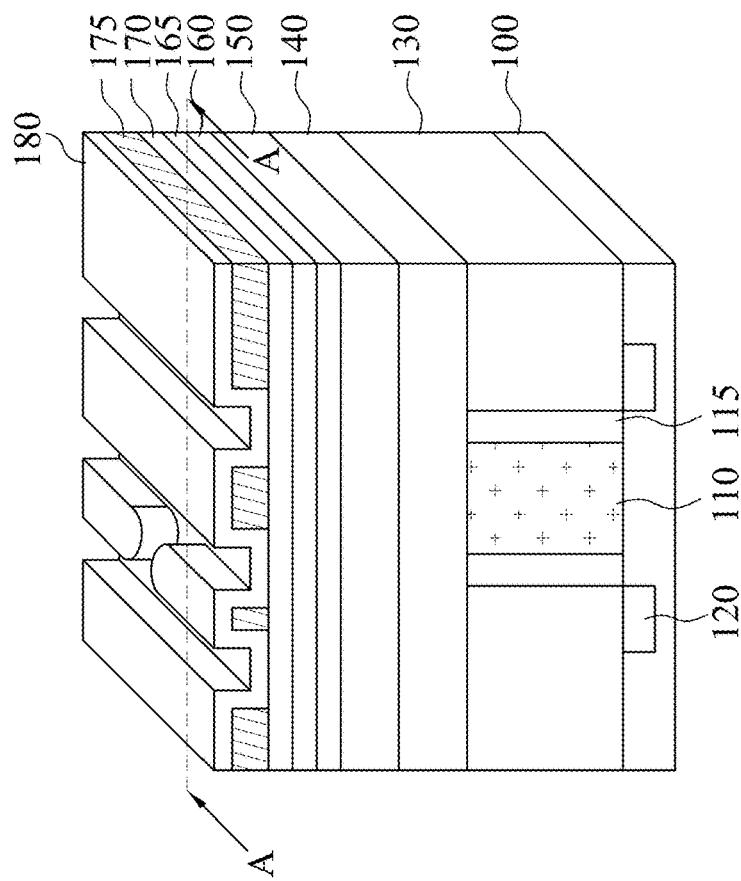

Reference is made to FIGS. 2A and 2B, in which FIG. 2B is a cross-sectional view along line A-A of FIG. 2A. A first spacer layer 180 is formed over the amorphous silicon layer 175. In some embodiments, the first spacer layer 180 is formed in a conformal manner. That is, the first spacer layer 180 may be formed conformal to the underlying structure (i.e., following the topography of underlying structure), such as the amorphous silicon layer 175 and the exposed portions of the TEOS layer 170. In some embodiments, the first spacer layer 180 may include titanium oxide, and thus the first spacer layer 180 may also be referred to as a first titanium oxide layer.

Reference is made to FIGS. 3A and 3B, in which FIG. 3B is a cross-sectional view along line A-A of FIG. 3A. A second spacer layer 190 is formed over the first spacer layer 180. In some embodiments, the second spacer layer 190 is formed in a conformal manner. That is, the second spacer layer 190 may be formed conformal to the first spacer layer 180 (i.e., following the topography of the first spacer layer 180). In some embodiments, the second spacer layer 190 may include titanium oxide, and thus the second spacer layer 190 may also be referred to as a second titanium oxide layer.

In some embodiments, the first and second spacer layers 180 and 190 may be made of the same material, such as titanium oxide (TiO). However, the first and second spacer layers 180 and 190 may be deposited via different processes and/or different process conditions. For example, the first spacer layer 180 may be deposited by ALD without using plasma treatment (i.e., plasma-free ALD), while the second spacer layer 190 may be deposited by ALD with plasma treatment (e.g., plasma-enhanced ALD (PEALD)). In some embodiments, the plasma treatment may use Ar, $N_2$, or $N_2O$ plasma. In this way, the second spacer layer 190 may include better crystalline quality than the first spacer layer 180, which in turn will increase the etching resistance of the second spacer layer 190 and hence reduce the etch rate of the second spacer layer 190 during the following etching processes (e.g., the etching process discussed in FIGS. 12A and 12B), and will improve the process reliability. In some embodiments, the first and second spacer layers 180 and 190 may be deposited under temperatures in a ranged from about 50° C. to about 200° C. In some embodiments, the first spacer layer 180 is deposited under a temperature less than 200° C. In some other embodiments, the second spacer layer 190 may be made of silicon nitride ($SiN_x$), metal oxide (e.g., aluminum oxide ($Al_2O_3$)), metal nitride (e.g., titanium nitride (TiN)), or other suitable materials.

After the second spacer layer 190 is formed, the first spacer layer 180 and the second spacer layer 190 can be collectively referred to as a composite spacer layer 200 (or a bilayer spacer film). In some embodiments, the composite spacer layer 200 may include first horizontal portions 200A horizontally extending along top surfaces of the amorphous silicon layer 175, vertical portions 200B vertically extending along sidewalls of the amorphous silicon layer 175, and second horizontal portions 200C horizontally extending along top surfaces of the exposed portions of the TEOS layer 170.

Figure 4B:
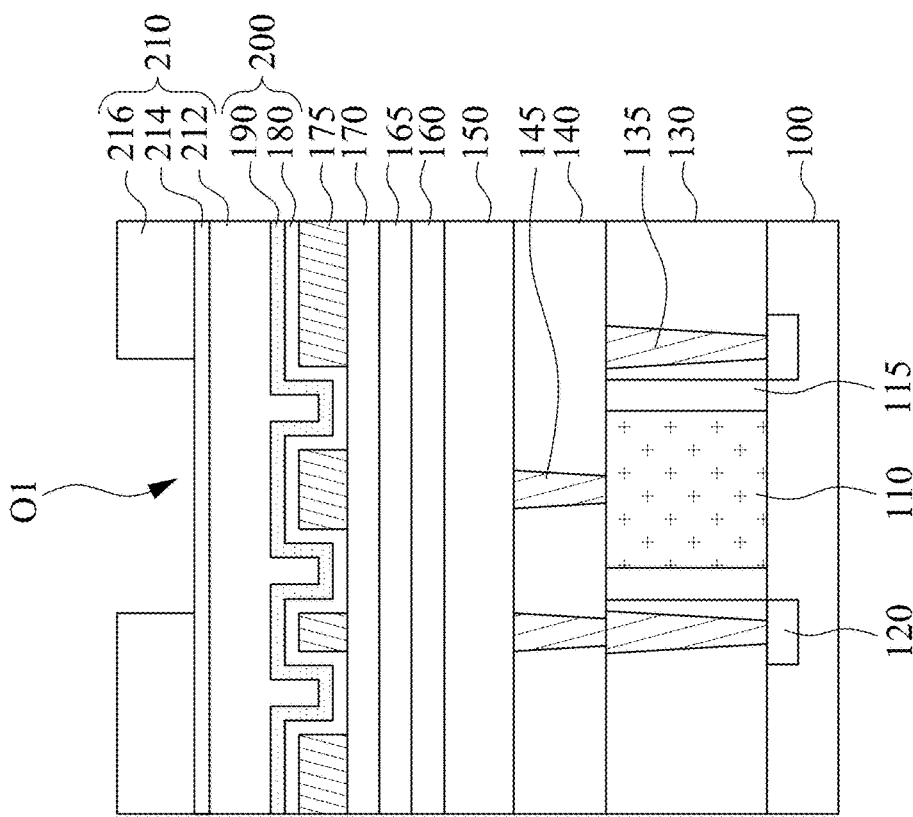
Figure 4A:
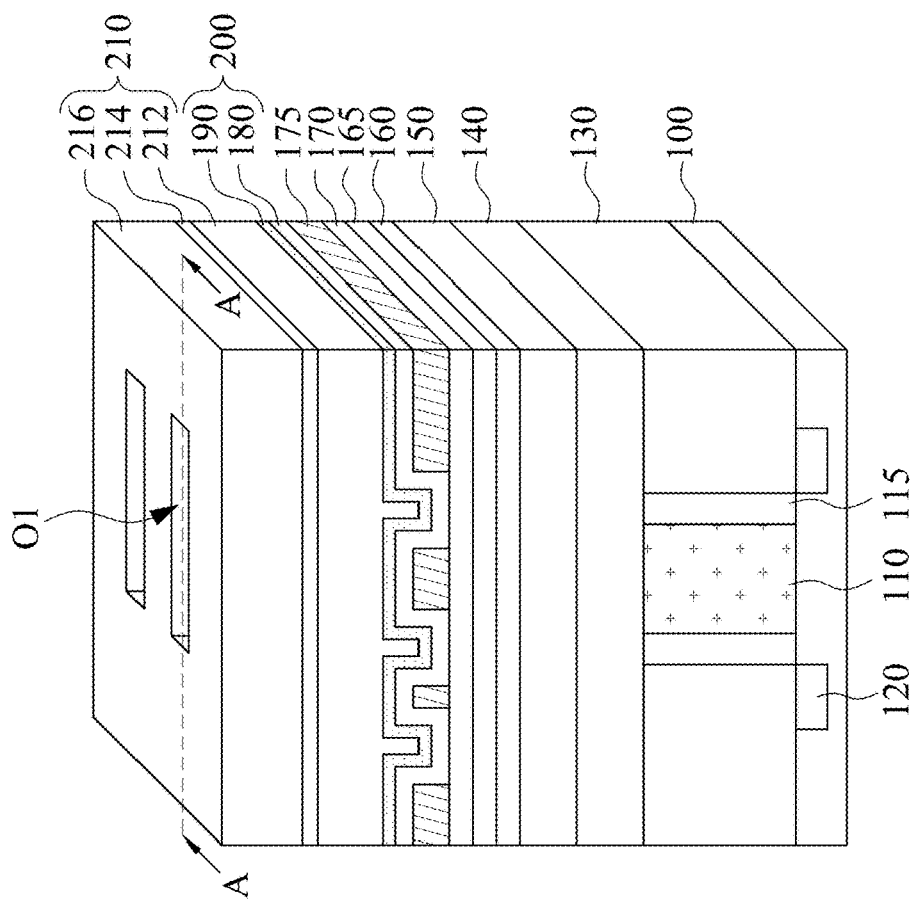

Reference is made to FIGS. 4A and 4B, in which FIG. 4B is a cross-sectional view along line A-A of FIG. 4A. A tri-layer photoresist 210 is formed over the composite spacer layer 200. In some embodiments, the tri-layer photoresist 210 may include a bottom layer (BL) 212, a middle layer (ML) 214, and a top layer (IL) 216. In some embodiments, the bottom layer 212 may include a $C_xH_yO_z$ material, the middle layer 214 may include a $SiC_xH_yO_z$ material, and the top layer 216 may include a $C_xH_yO_z$ material. The $C_xH_yO_z$ material of the bottom layer 212 may be the same as the $C_xH_yO_z$ material of the top layer 212 in some embodiments, or may also be different in other embodiments. The top layer 216 also includes a photo-sensitive element, such as a photo-acid generator (PAG). This allows a photolithography process to be performed to pattern the top layer 212. It is understood that in other embodiments, one or more layers of the tri-layer photoresist may be omitted, or additional layers may be provided as a part of the tri-layer photoresist, and the layers may be formed in difference sequences.

In FIGS. 4A and 4B, the top layer 216 is patterned by a photolithography process, which may include one or more exposure, developing, rinsing, and baking processes (not necessarily performed in this order). The photolithography process patterns the top layer 216 into a photoresist mask, which may have one or more trenches or openings that expose the middle layer 214 therebelow. As an example, openings O1 are formed in the top layer 216, and the openings O1 expose portions of the middle layer 214.

Figure 5B:
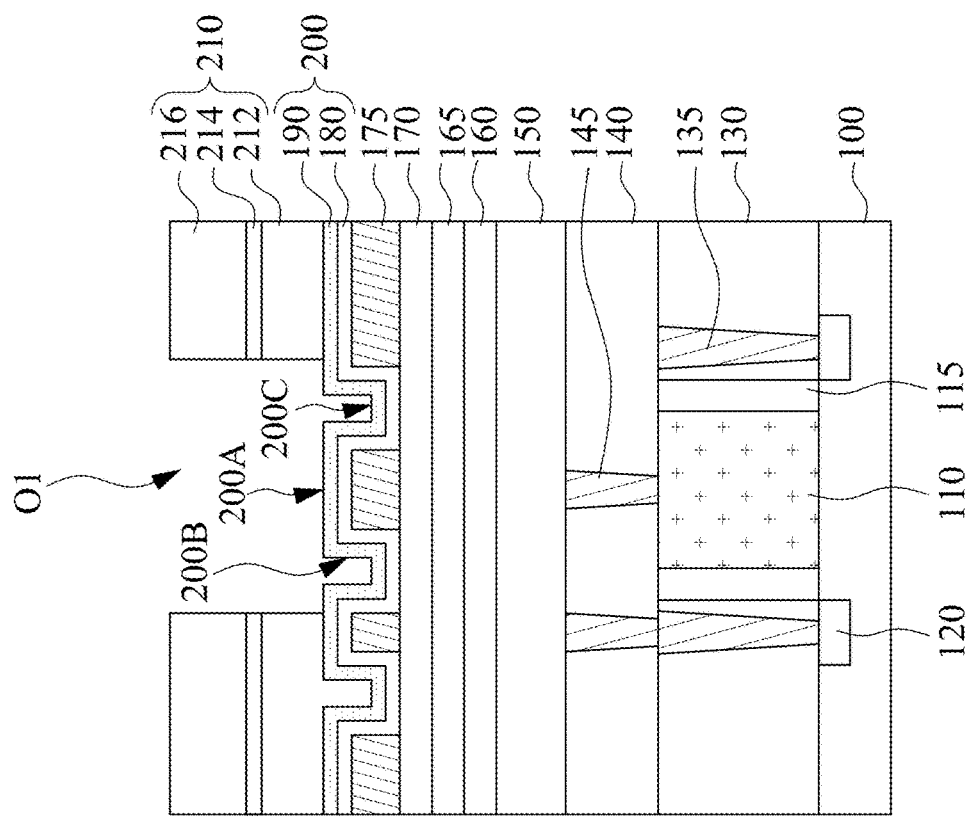
Figure 5A:
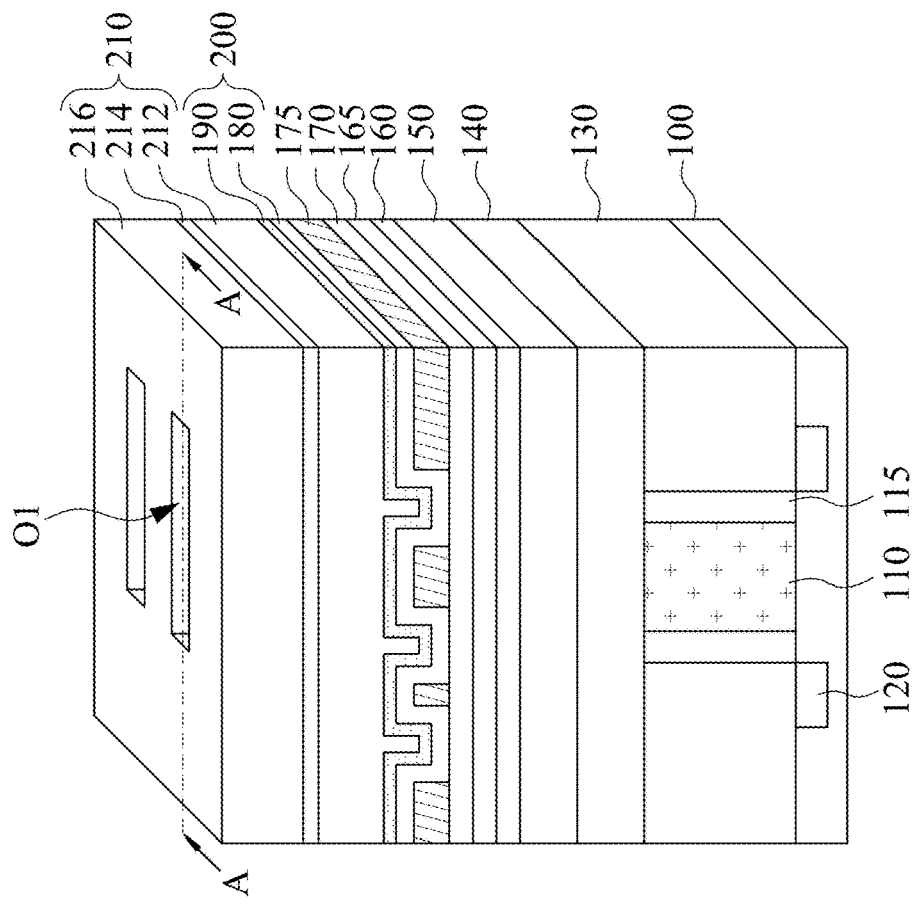

Reference is made to FIGS. 5A and 5B, in which FIG. 5B is a cross-sectional view along line A-A of FIG. 5A. One or more etching processes may be performed to "open" the middle layer 214 and the bottom layer 212. Stated another way, the openings O1 in the top layer 216 are extended downwardly into the middle layer 214 and the bottom layer 212. After the openings O1 are formed in the middle layer 214 and the bottom layer 212, portions of the composite spacer layer 200 is exposed ion greater details, the first horizontal portions 200A, the vertical portions 200B, and the second horizontal portions 200C of the composite spacer layer 200 are exposed by the openings O1.

Figure 6B:
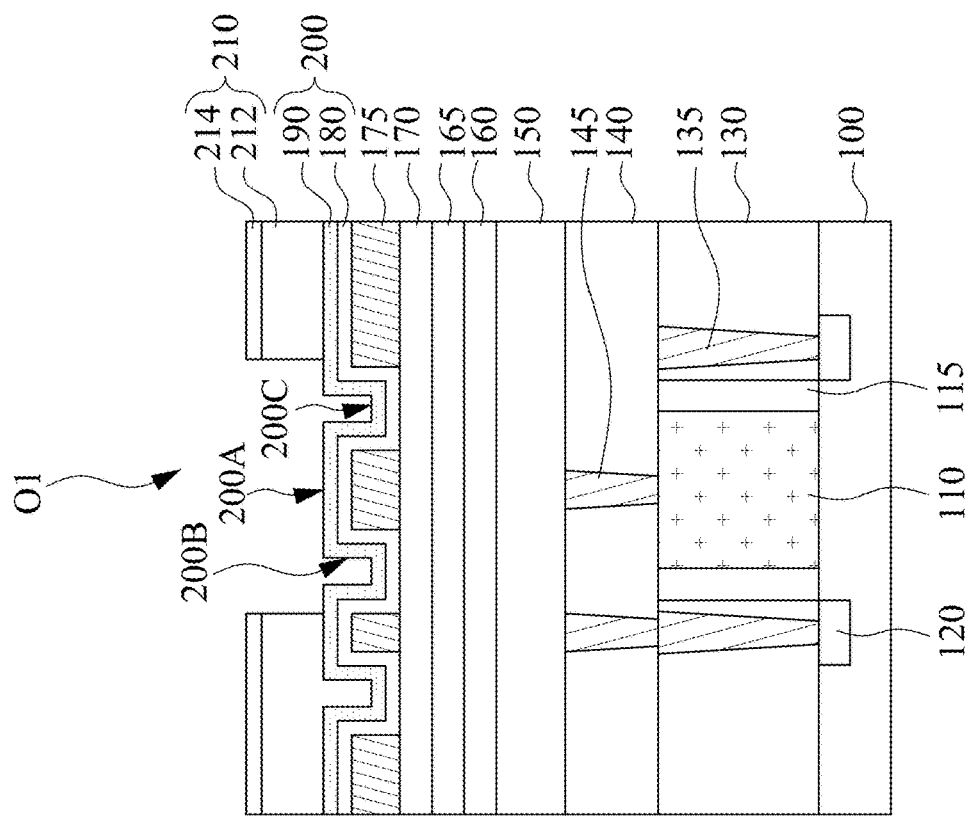
Figure 6A:
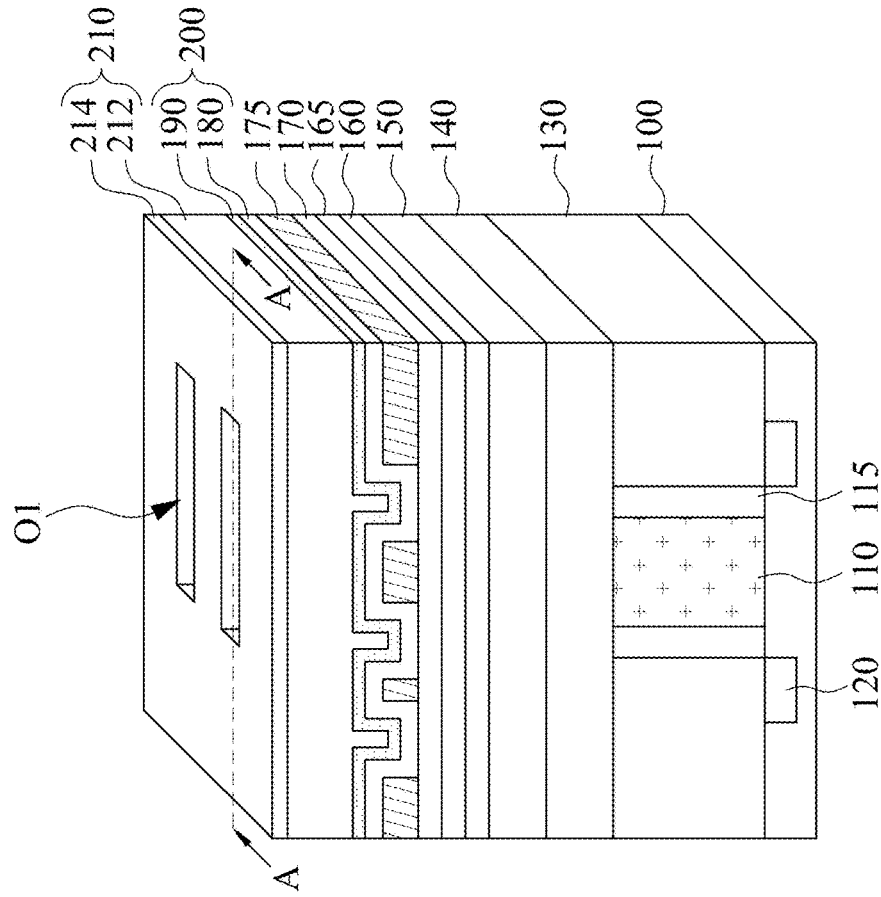

Reference is made to FIGS. 6A and 6B, in which FIG. 6B is a cross-sectional view along line A-A of FIG. 6A. The top layer 216 may be removed to expose the middle layer 214. In some embodiments, the top layer 216 may be removed by suitable process, such as plasma ashing, wet strip, or combinations thereof.

Figure 7B:
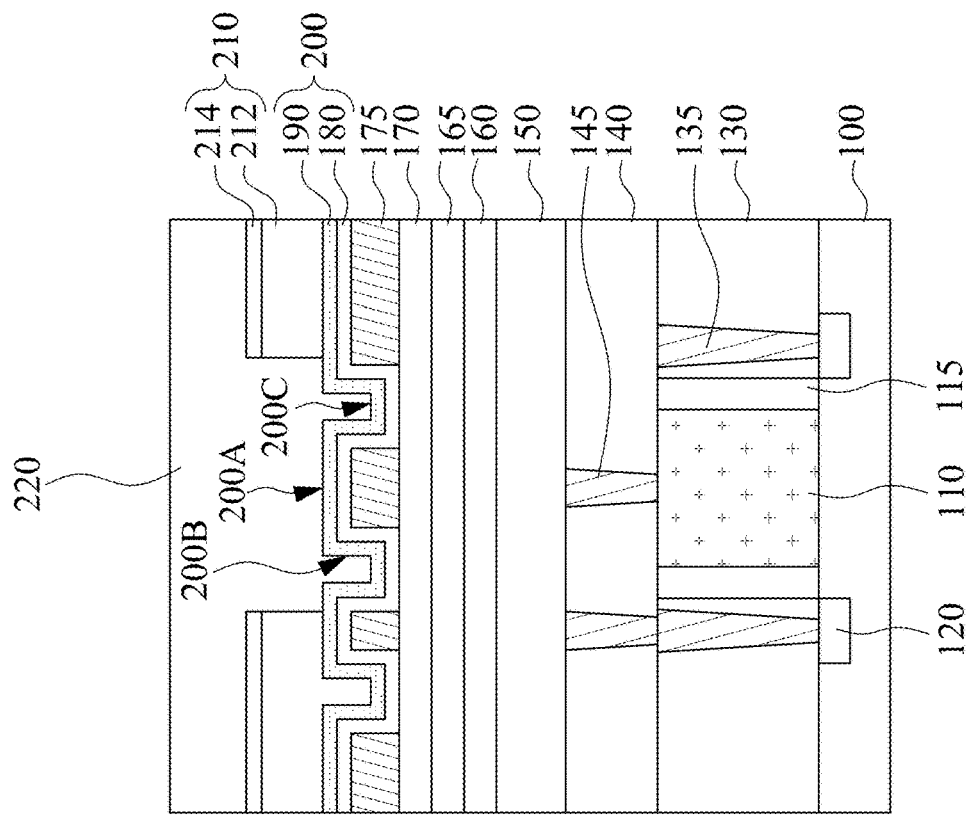
Figure 7A:
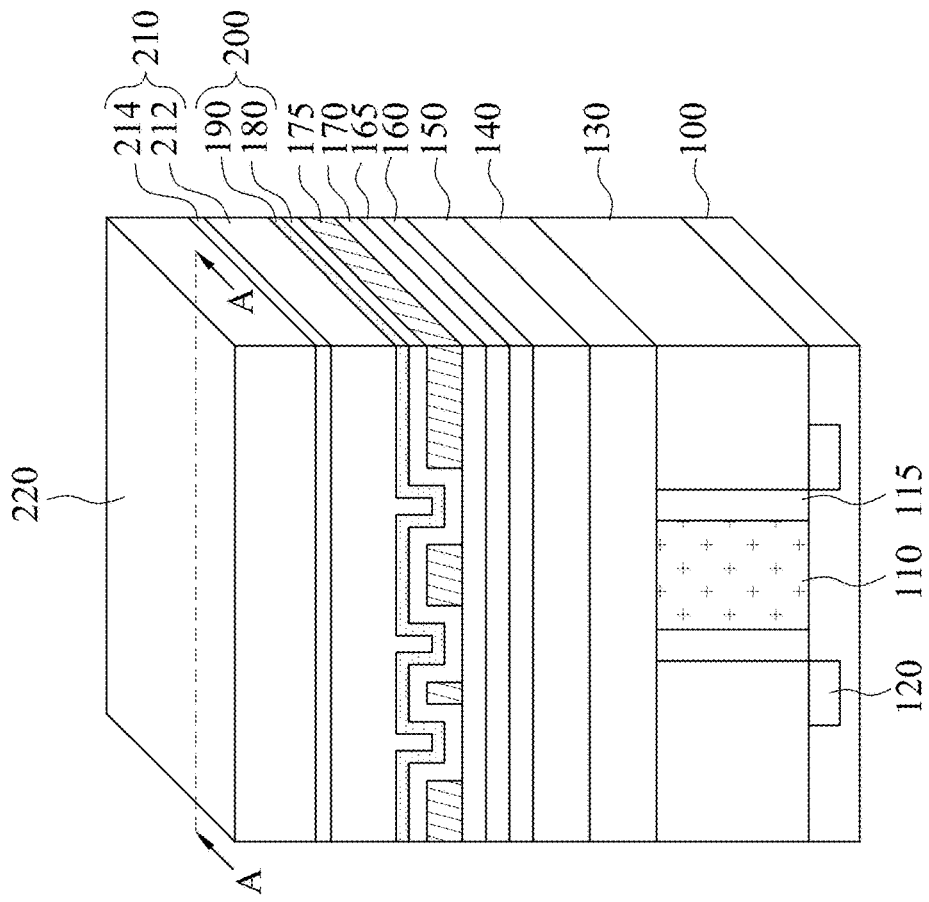

Reference is made to FIGS. 7A and 7B, in which FIG. 7B is a cross-sectional view along line A-A of FIG. 7A. A hard mask layer 220 is formed over the middle layer 214 and filling the openings O1 of the middle layer 214 and the bottom layer 212. Accordingly, the hard mask layer 220 may be formed in contact with the second spacer layer 190 of the composite spacer layer 200. In greater details, the hard mask layer 220 may be in contact with the first horizontal portions 200A, the vertical portions 200B, and the second horizontal portions 200C of the composite spacer layer 200 that are exposed by the openings O1. In some embodiments, the hard mask layer 220 may include a dielectric material. In some embodiments, the hard mask layer 220 may include oxide, such as silicon oxide, silicon dioxide ($SiO_2$), or other suitable materials.

Reference is made to FIGS. 8A and 8B, in which FIG. 8B is a cross-sectional view along line A-A of FIG. 8A. The hard mask layer 220 (see FIGS. 7A and 7B) is etched back to lower a top surface of the hard mask layer 220 to form a plurality of hard masks 230. In some embodiments, the top surface of the hard mask layer 220 may be lowered to a position that is below a topmost position of the first horizontal portions 200A of the composite spacer layer 200. Stated another way, the top surface of the hard mask layer 220 may be lowered to a position that is below a topmost position of the second spacer layer 190 of the composite spacer layer 200. In some embodiments, the top surfaces of the hard masks 230 may be lower than the topmost position of the second spacer layer 190 of the composite spacer layer 200, and may be higher than the topmost position of the first spacer layer 180 of the composite spacer layer 200. In some other embodiments, the top surface of the hard mask layer 220 may be lowered to a position that is substantially level with the topmost position of the first horizontal portions 200A of the composite spacer layer 200, or is substantially level with the topmost position of the second spacer layer 190 of the composite spacer layer 200.

Accordingly, after the etch back process, the top surfaces of the first horizontal portions 200A of the composite spacer layer 200 are exposed by the hard masks 230, and are free from coverage by the material of the hard masks 230. In some embodiments, the hard masks 230 may remain in contact with the sidewalk of the vertical portion 200B of the composite spacer layer 200 and the top surfaces of the second horizontal portions 200C of the composite spacer layer 200.

Reference is made to FIGS. 9A and 9B, in which FIG. 9B is a cross-sectional view along line A-A of FIG. 9A. The middle layer 214 and the bottom layer 212 of the tri-layer photoresist 210 are removed. In some embodiments, the middle layer 214 and the bottom layer 212 may be removed by suitable process, such as etching.

Figure 10B:
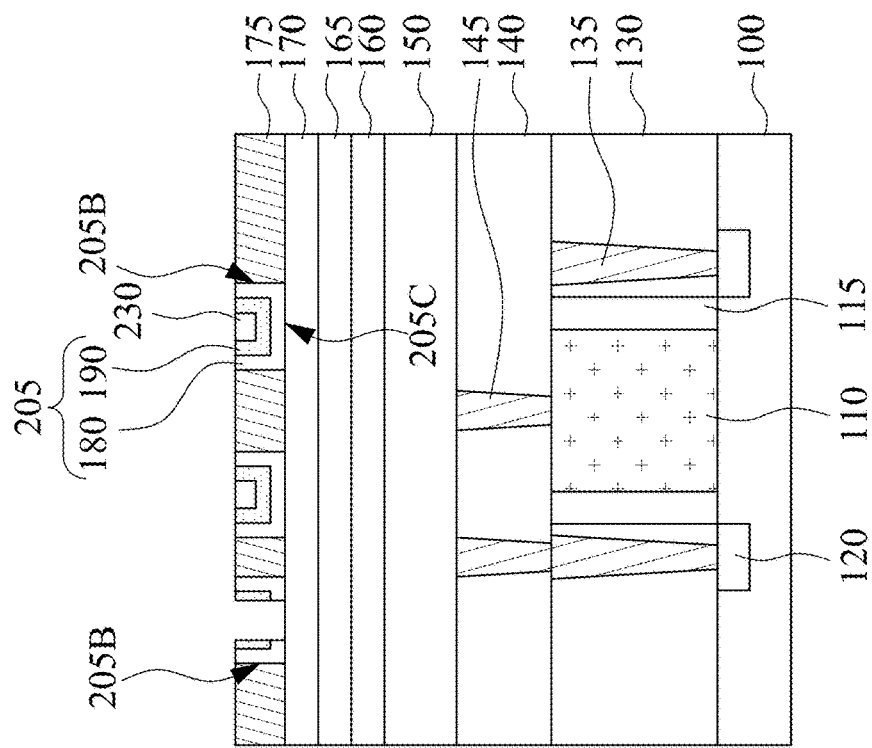
Figure 10A:
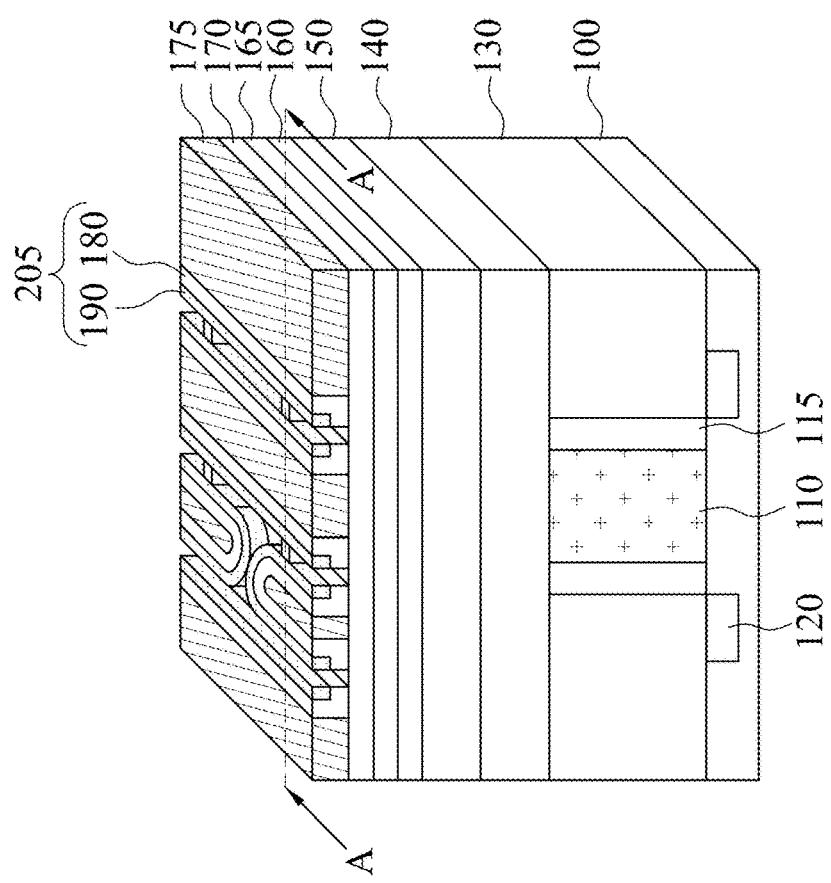

Reference is made to FIGS. 10A and 10B, in which FIG. 10B is a cross-sectional view along line A-A of FIG. 10A. An anisotropic etching process is performed to remove the first horizontal portions 200A and the second horizontal portions 200C of the composite spacer layer 200 to form a plurality of composite spacers 205. After the anisotropic etching process, because the first horizontal portions 200A and the second horizontal portions 200C of the composite spacer layer 200 are removed, the top surfaces of the amorphous silicon layer 175 are exposed, and portions of the TEOS layer 170 are exposed. In some embodiments, the composite spacers 205 may include the remaining portions of the vertical portions 200B of the composite spacer layer 200, and thus the composite spacers 205 may include a vertical portion 205B in contact with the sidewalls of the amorphous silicon layer 175. In some embodiments, after the anisotropic etching process, the top surfaces of the hard masks 230 may be substantially level with top surfaces of the vertical portions 205B of the composite spacer layer 205.

Moreover, during the anisotropic etching process, the hard masks 230 can act as a protective layer to protect the underlying second horizontal portions 200C of the composite spacer layer 200. Accordingly, parts of the second horizontal portions 200C of the composite spacer layer 200 that are under and protected by the hard masks 230 may remain after the anisotropic etching process. As a result, the composite spacers 205 may also include horizontal portions 205C that are vertically below the hard masks 230. Stated another way, the horizontal portions 205C of the composite spacers 205 only exist below the hard masks 230.

Figure 11B:
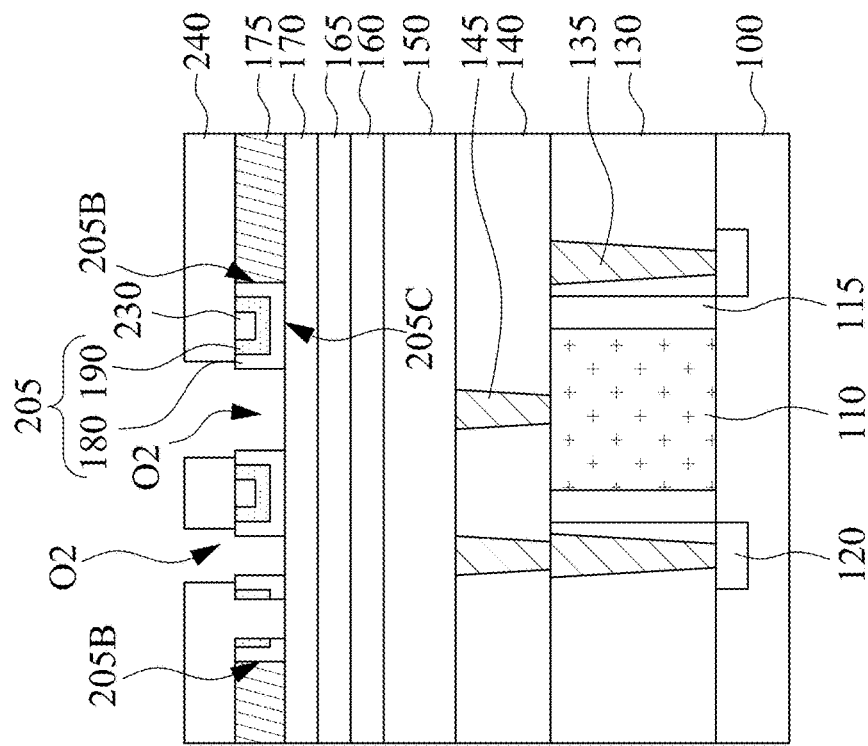
Figure 11A:
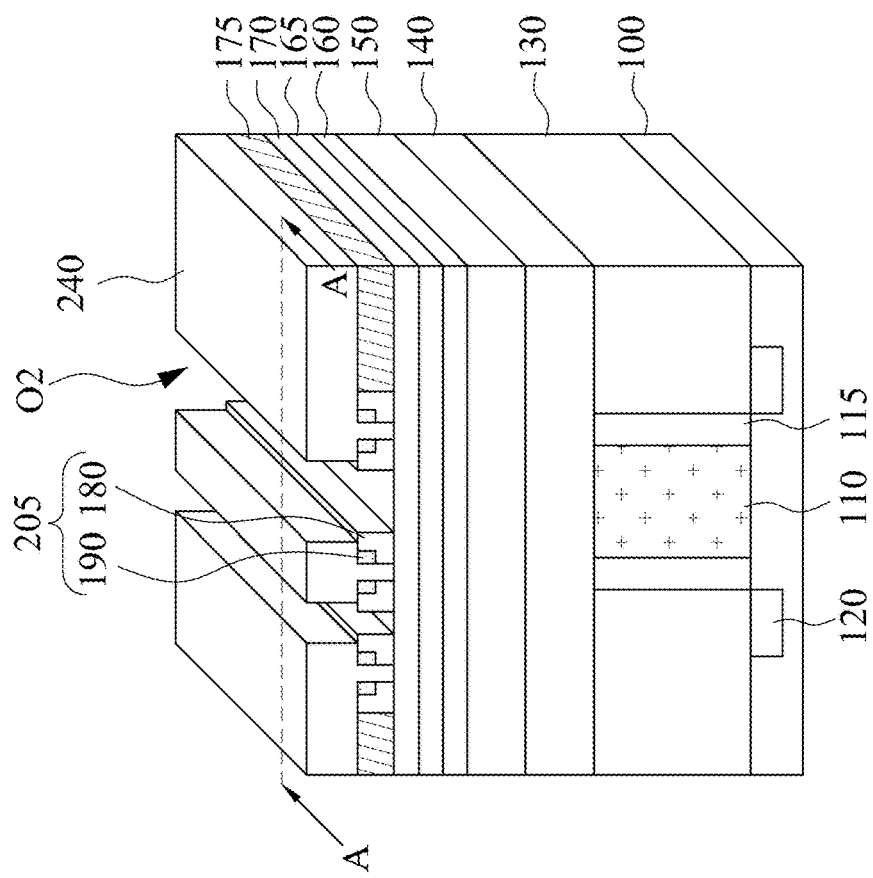

Reference is made to FIGS. 11A and 11B, in which FIG. 11B is a cross-sectional view along line A-A of FIG. 11A. A photoresist 240 is formed over the substrate 100. In some embodiments, the photoresist 240 may include openings O2 that expose portions of the amorphous silicon layer 175 (see FIGS. 10A and 10B). Next, an etching process is performed to remove the portions of the amorphous silicon layer 175 that are exposed by the openings O2 of the photoresist 240. Accordingly, after the portions of the amorphous silicon layer 175 are removed, portions of the TEOS layer 170 are exposed.

Figure 12B:
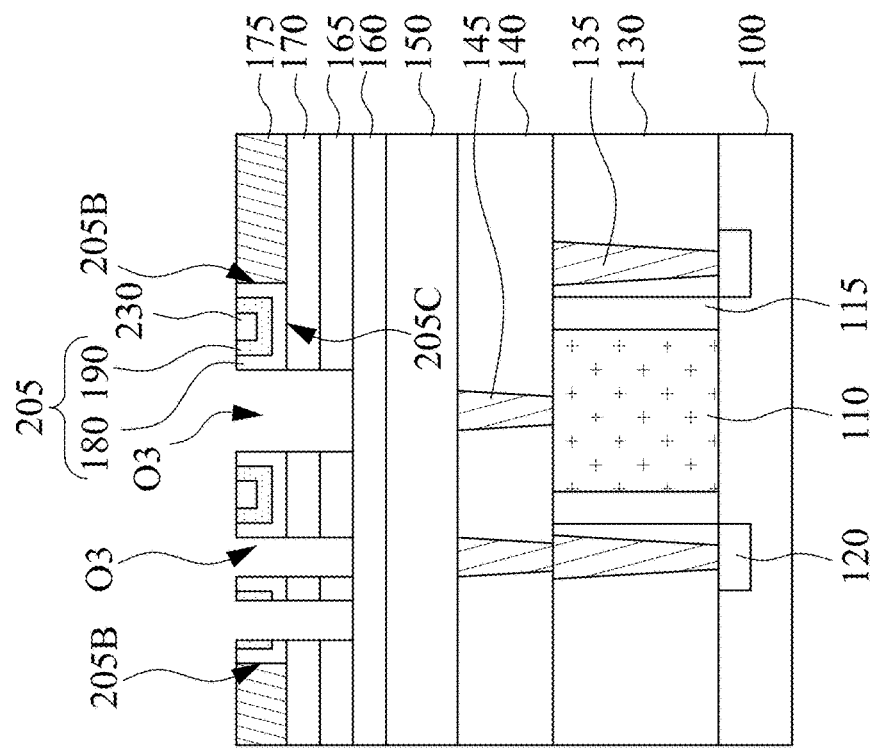
Figure 12A:
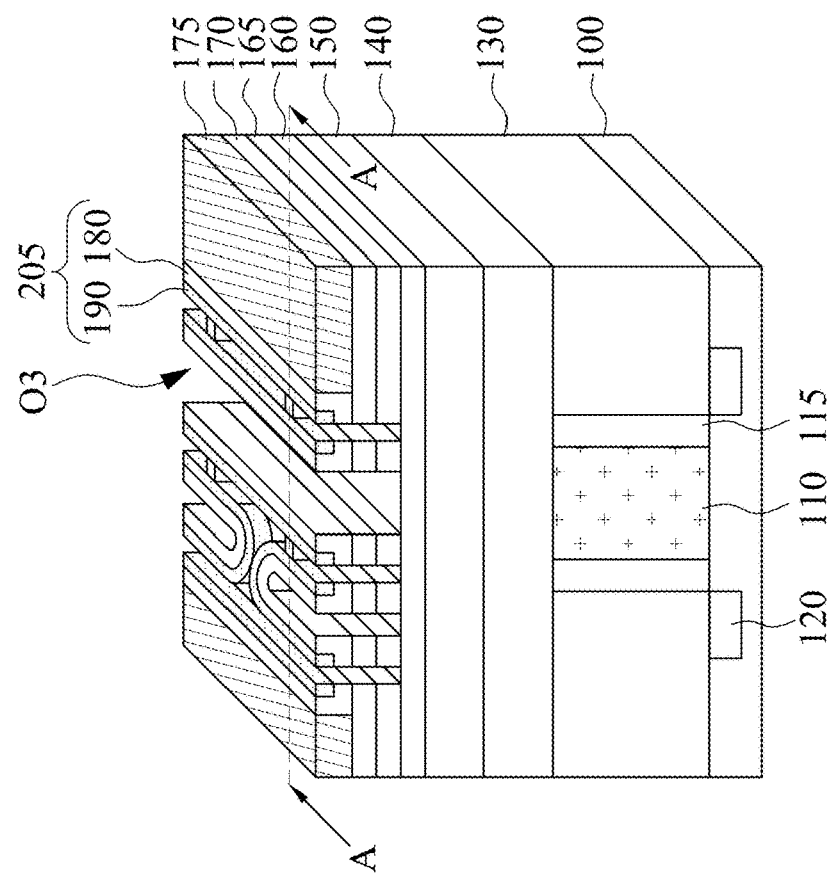

Reference is made to FIGS. 12A and 12B, in which FIG. 12B is a cross-sectional view along line A-A' of FIG. 12A. The photoresist 240 is removed. Next, an etching process is performed, by using the remaining portions of the amorphous silicon layer 175, the composite spacers 205, and the hard masks 230 as etch mask, to pattern the TEOS layer 170 and the titanium nitride layer 165. After the etching process, the patterned TEOS layer 170 and the patterned titanium nitride layer 165 may include openings O3 that expose the ARC 160.

As mentioned above, because the second spacer layer 190 has better crystalline quality than the first spacer layer 180, the second spacer layer 190 may have higher etching resistance to the etching process of FIGS. 12A and 12B. Stated another way, the second spacer layer 190 and the hard masks 230 may provide sufficient etching selectivity during the etching process. In some embodiments, the hard masks 230 may be consumed during the etching process and may not have enough height as an etch mask. However, the second spacer layer 190, which has etching selectivity to the hard masks 230, may provide sufficient etching resistance to the etching process, and thus will reduce process defect at smaller line width and critical dimension. Accordingly, the process reliability and the device performance may be improved. Stated differently, in some embodiments, this etching step etches the second spacer layer 190 at a lower etch rate than it etches the first spacer layer 180 and/or the hard masks 230.

Figure 13B:
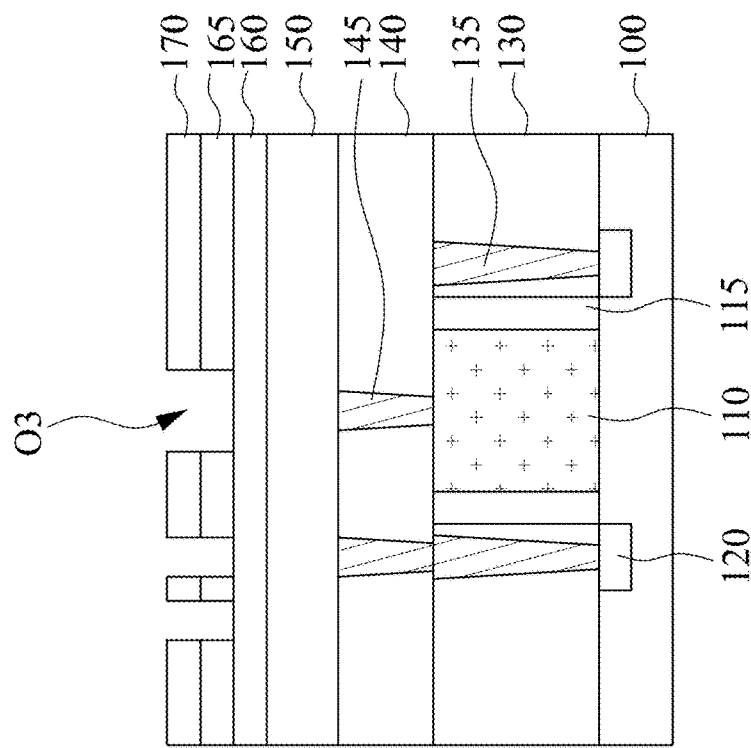
Figure 13A:
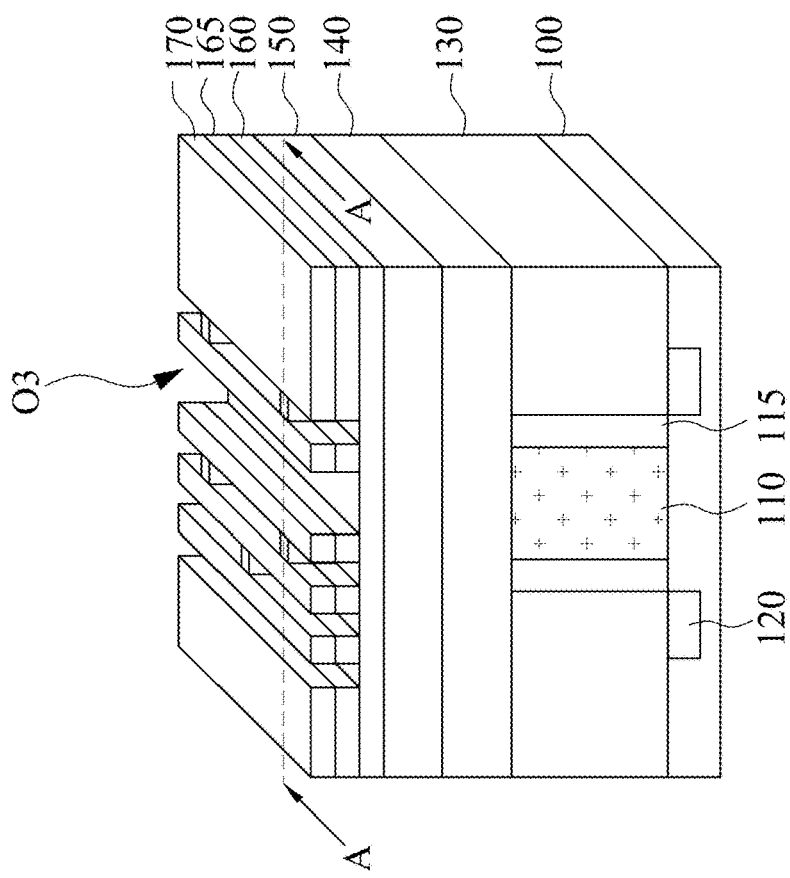

Reference is made to FIGS. 13A and 13B, in which FIG. 13B is a cross-sectional view along line A-A of FIG. 13A. The remaining portions of the amorphous silicon layer 175, the composite spacers 205, and the hard masks 230 are removed. In some embodiments, the amorphous silicon layer 175, the composite spacers 205, and the hard masks 230 may be removed by suitable etching process, such as dry etch, wet etch, or combinations thereof.

Figure 14B:
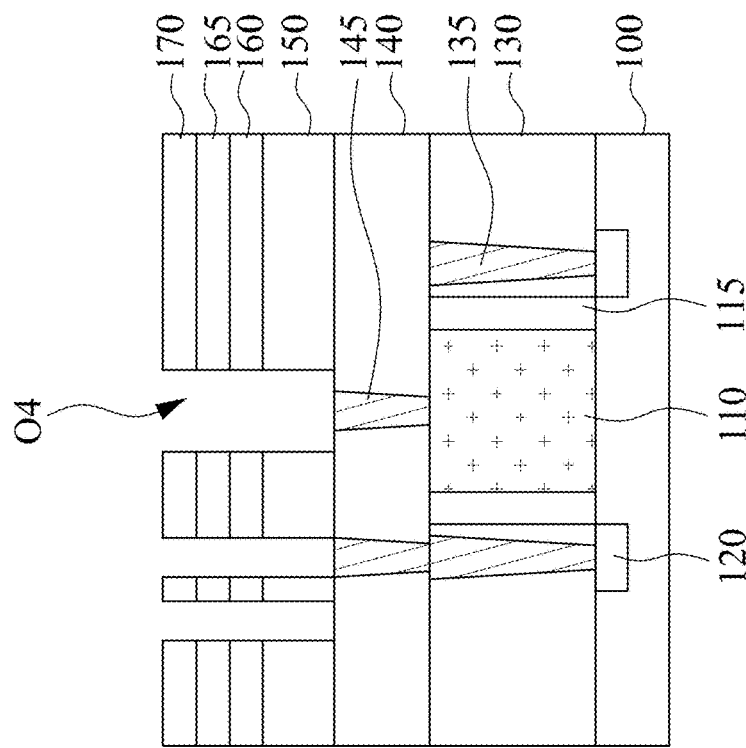
Figure 14A:
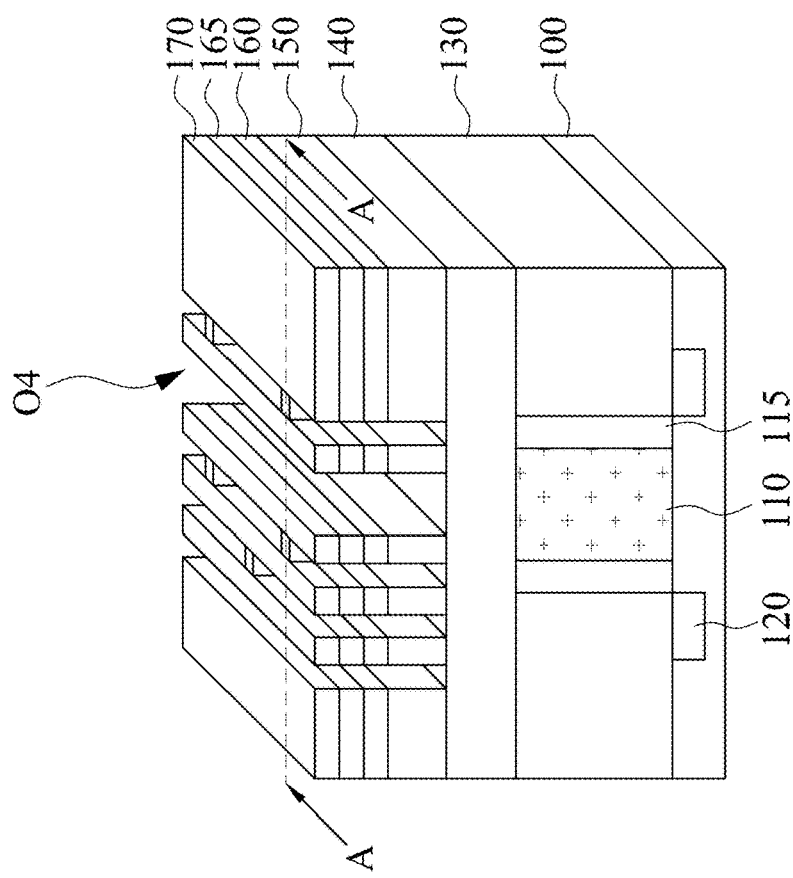

Reference is made to FIGS. 14A and 14B, in which FIG. 14B is a cross-sectional view along line A-A of FIG. 14A. An etching process is performed, by using the patterned TEOS layer 170 and the patterned titanium nitride layer 165 as etch mask, to pattern the ARC layer 160 and the ILD layer 150. After the etching process, the patterned ARC layer 160 and the patterned ILD layer 150 may include openings O4 that expose the ILD layer 140 and the via plugs 145.

Figure 15B:
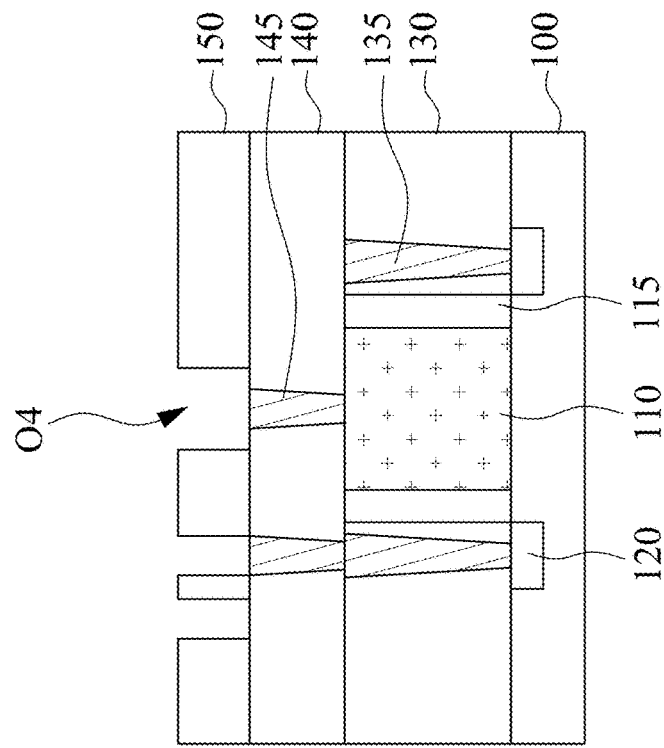
Figure 15A:
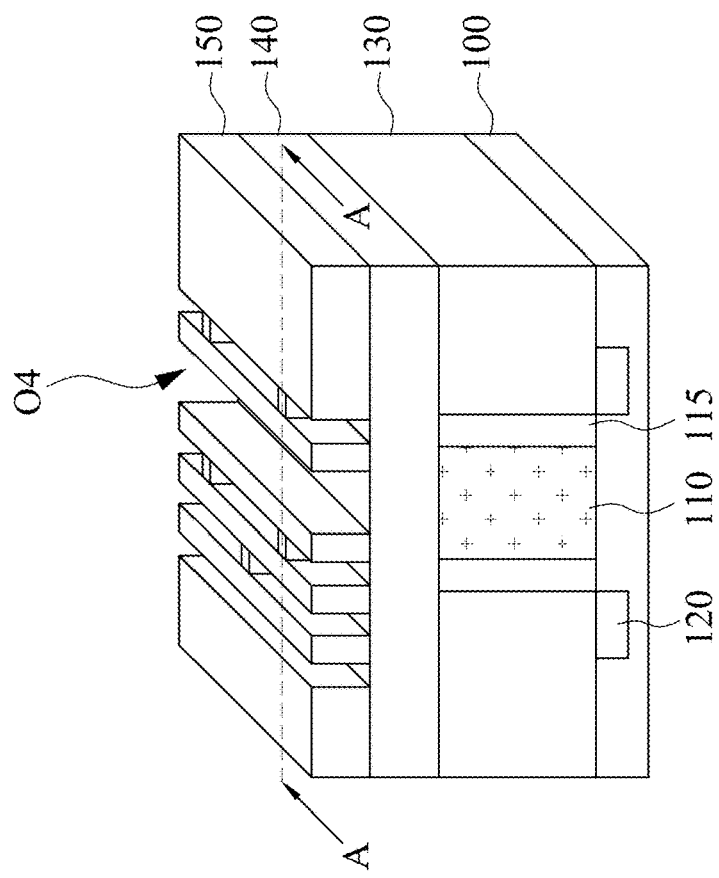

Reference is made to FIGS. 15A and 15B, in which FIG. 15B is a cross-sectional view along line A-A of FIG. 15A. The patterned TEOS layer 170, the patterned titanium nitride layer 165, and the patterned ARC layer 160 are removed. In some embodiments, the patterned TEOS layer 170, the patterned titanium nitride layer 165, and the patterned ARC layer 160 are removed may be removed by suitable etching process, such as dry etch, wet etch, or combinations thereof.

Figure 16B:
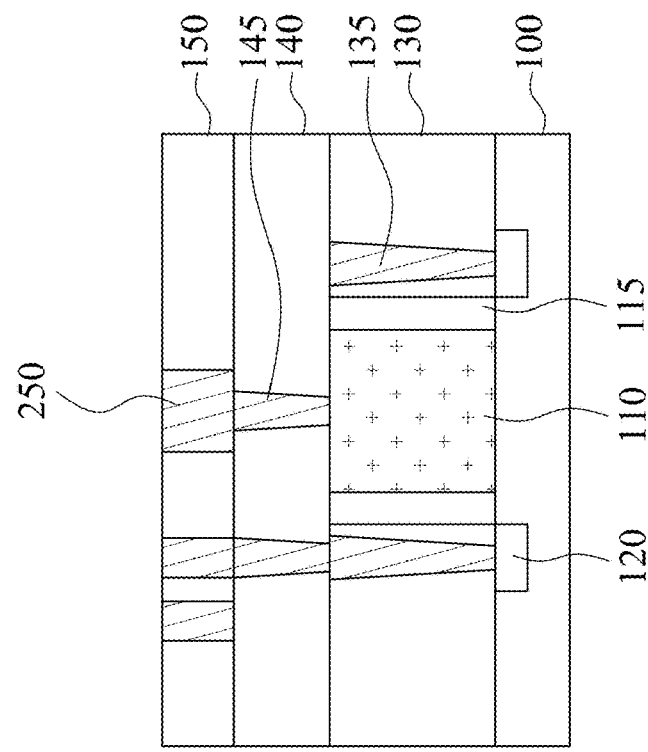
Figure 16A:
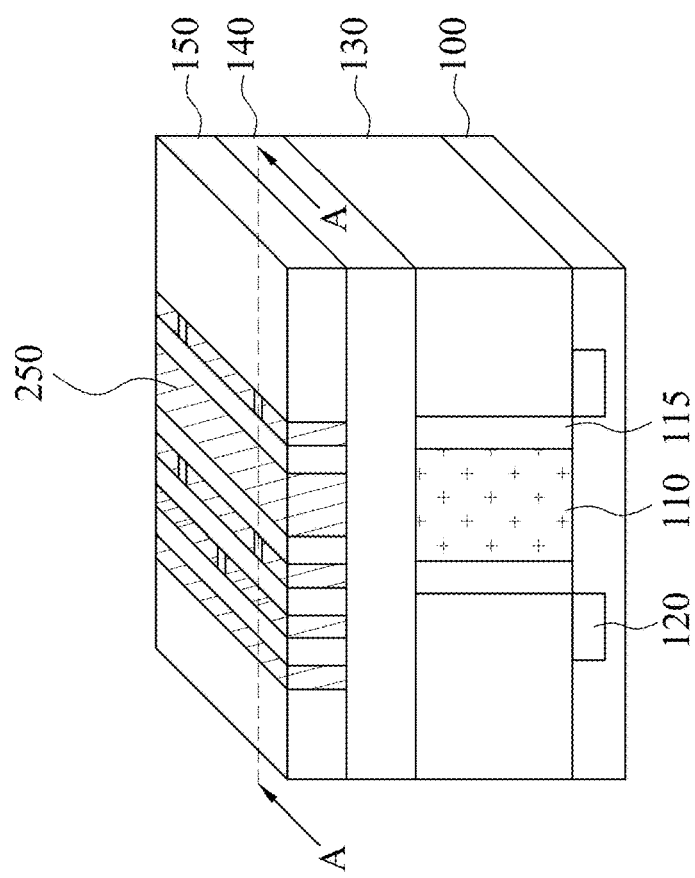

Reference is made to FIGS. 16A and 16B, in which FIG. 16B is a cross-sectional view along line A-A of FIG. 16A. Metal lines 250 are formed in the openings O4 of the patterned ILD layer 150, and may be electrically connected to the via plugs 145. In some embodiments, the metal lines 250 may be formed by, for example, depositing a conductive material over the ILD layer 150 and filling the openings O4 of the ILD layer 150, and performing a CMP process to remove excess conductive material until the ILD layer 150 is exposed. In some embodiments, the metal lines 250 may include Ti, W, Co, Cu, Al, Mo, MoW, W, TiN, TaN, WN, combinations thereof, or other suitable conductive material.

FIGS. 17A to 26B show various stages of a sequential manufacturing operation of a semiconductor device according to an embodiment of the present disclosure. Some elements of FIGS. 17A to 26B are similar to those described in FIGS. 1A to 16B, such elements are labeled the same, and relevant details will not be repeated for simplicity. It is understood that additional operations can be provided before, during, and after the processes shown by FIGS. 17A to 26B, and some of the operations described below can be replaced or eliminated, for additional embodiments of the method. Material, configuration, dimensions and/or processes the same as or similar to the foregoing embodiments described with FIGS. 17A to 26B may be employed in the following embodiments, and detailed explanation thereof may be omitted.

Figure 17B:
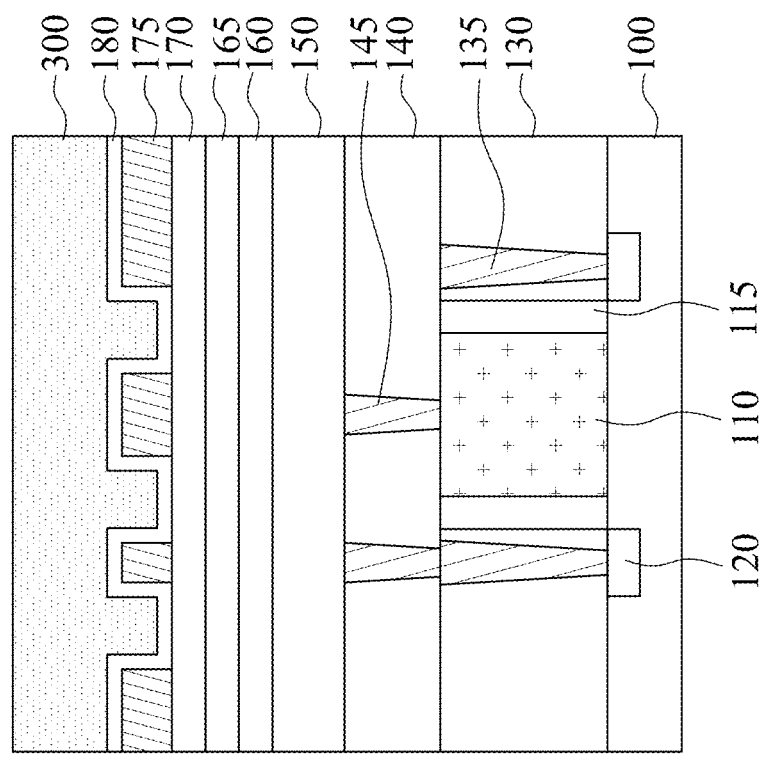
Figure 17A:
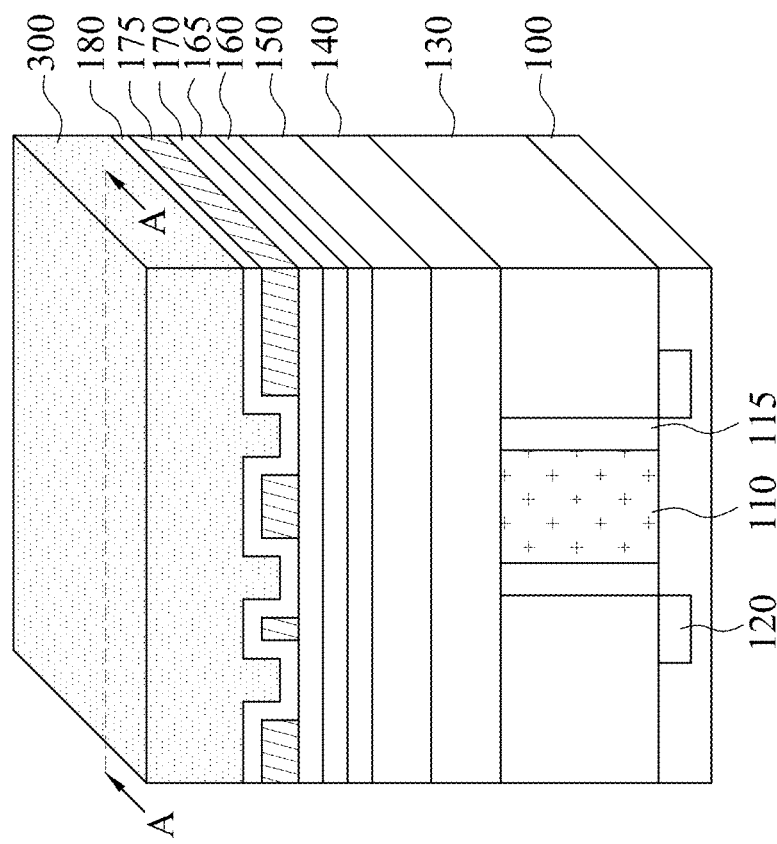

Reference is made to FIGS. 17A and 17B, in which FIG. 17B is a cross-sectional view along line A-A of FIG. 17A. FIGS. 17A and 17B illustrate deposition of first and second spacer layers, as previously described in the step of FIGS. 3A and 3B. FIGS. 17A and 17B are different from FIGS. 3A and 3B, at least in that a second spacer layer 300 is formed overfilling the spaces defined by the amorphous silicon layer 175, instead of formed in a conformal manner. Stated differently, the second spacer layer 300 is non-conformal to the underlying first spacer layer 180. The material and the formation method of the second spacer layer 300 may be similar to those of the second spacer layer 190 discussed in FIGS. 1A to 16B. In some embodiments, the second spacer layer 300 may be formed by a timed deposition process until an entirety of the top surface of the second spacer layer 300 is higher than the topmost position of the first spacer layer 180. In some embodiments, a CMP process may be optionally performed to planarize the top surface of the second spacer layer 300.

Figure 18B:
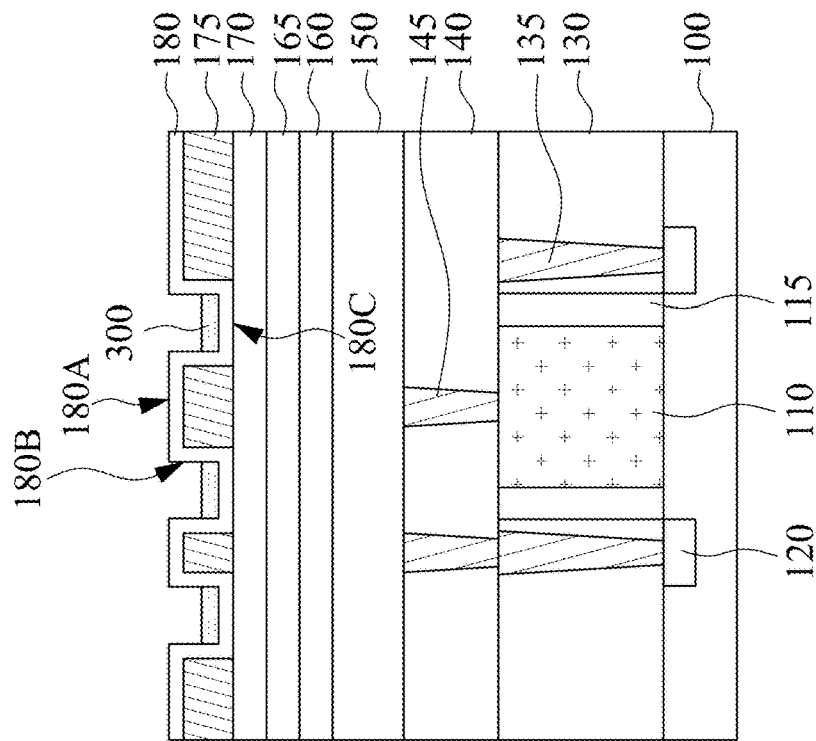
Figure 18A:
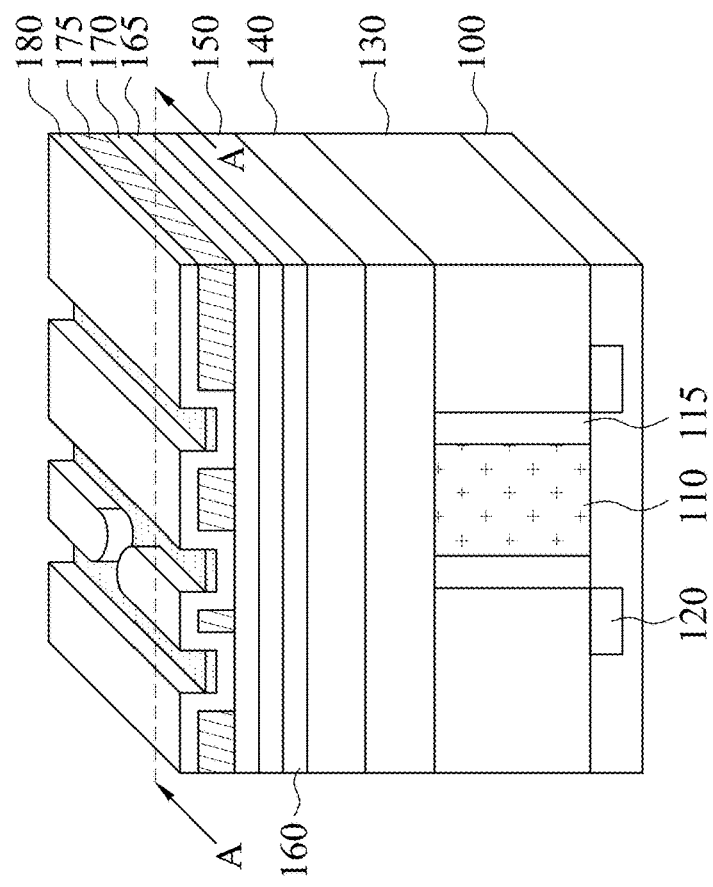

Reference is made to FIGS. 18A and 18B, in which FIG. 18B is a cross-sectional view along line A-A of FIG. 18A. The second spacer layer 300 is etched back to lower the top surface of the second spacer layer 300. In greater details, the top surface of the second spacer layer 300 may be lowered to a position under the topmost position of the first spacer layer 180. In some embodiments, the top surface of the second spacer layer 300 may be lowered to a position under the top surface of the amorphous silicon layer 175. In some embodiments, the first spacer layer 180 and the second spacer layer 300 can also be collectively referred to as a composite spacer. In some embodiments, the second spacer layer 300 is etched back by a selective etching process that uses an etchant that etches the second spacer layer 300 at a faster etch rate than etching the first spacer layer 180.

In some embodiments, the first spacer layer 180 may include first horizontal portions 180A horizontally extending along top surfaces of the amorphous silicon layer 175, vertical portions 180B vertically extending along sidewalls of the amorphous silicon layer 175, and second horizontal portions 180C horizontally extending along top surfaces of the TEOS layer 170. During the etch back process, portions of the second spacer layer 300 are removed to expose the first horizontal portions 180A of the first spacer layer 180, and expose upper parts of the vertical portions 180B of first spacer layer 180. After the etch back process, the remaining portions of the second spacer layer 300 still cover the second horizontal portions 180C of the first spacer layer 180.

Figure 19B:
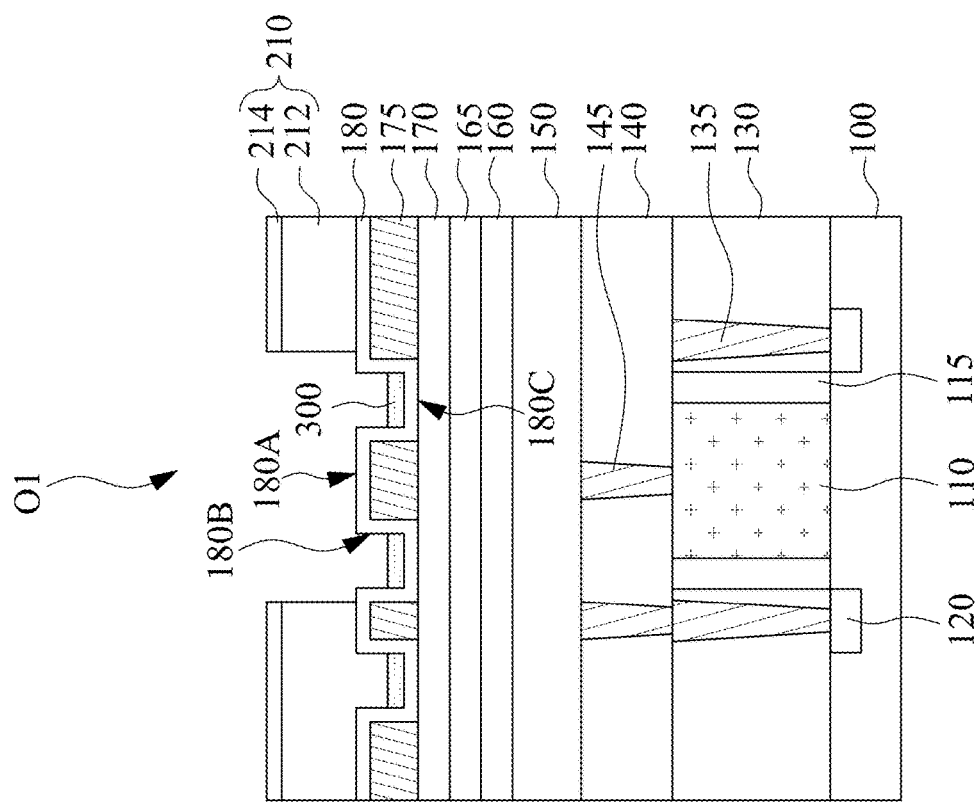
Figure 19A:
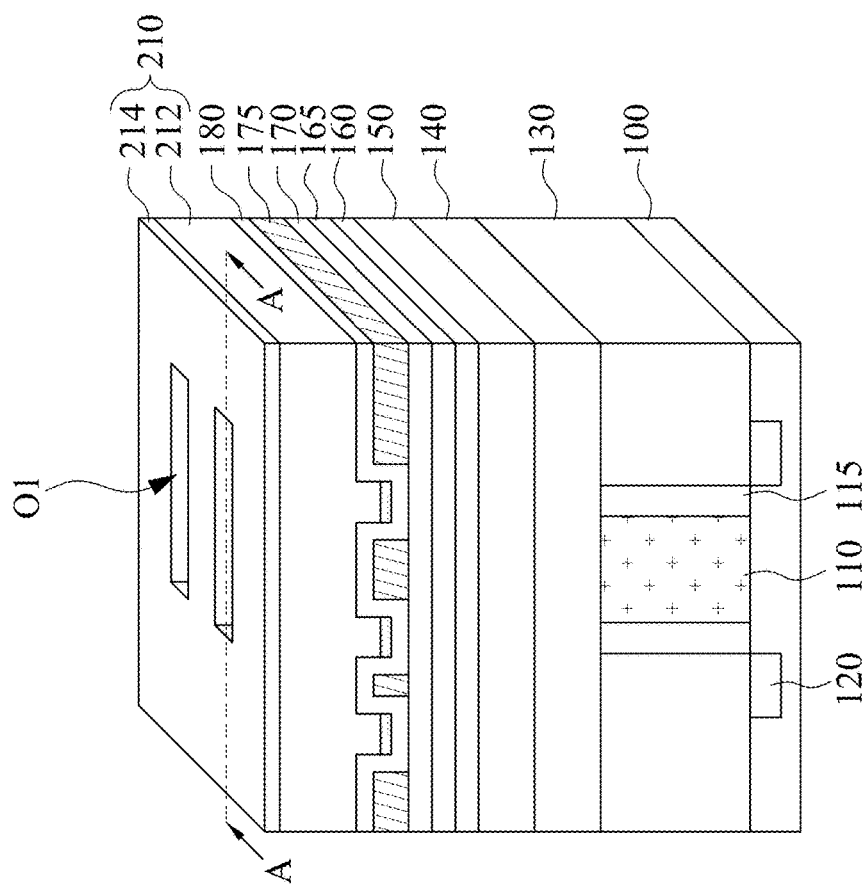

Reference is made to FIGS. 19A and 19B, in which FIG. 19B is a cross-sectional view along line A-A of FIG. 19A. The structure in FIGS. 18A and 18B may undergo the processes discussed in FIGS. 4A to 6B, and the resulting structure is shown in FIGS. 19A and 19B. A photoresist 210, which includes a bottom layer (BL) 212 and a middle layer (ML) 214, is formed over the substrate 100. In some embodiments, the photoresist 210 includes openings O1 that expose portions of the first spacer layer 180 and the second spacer layer 300.

Figure 20B:
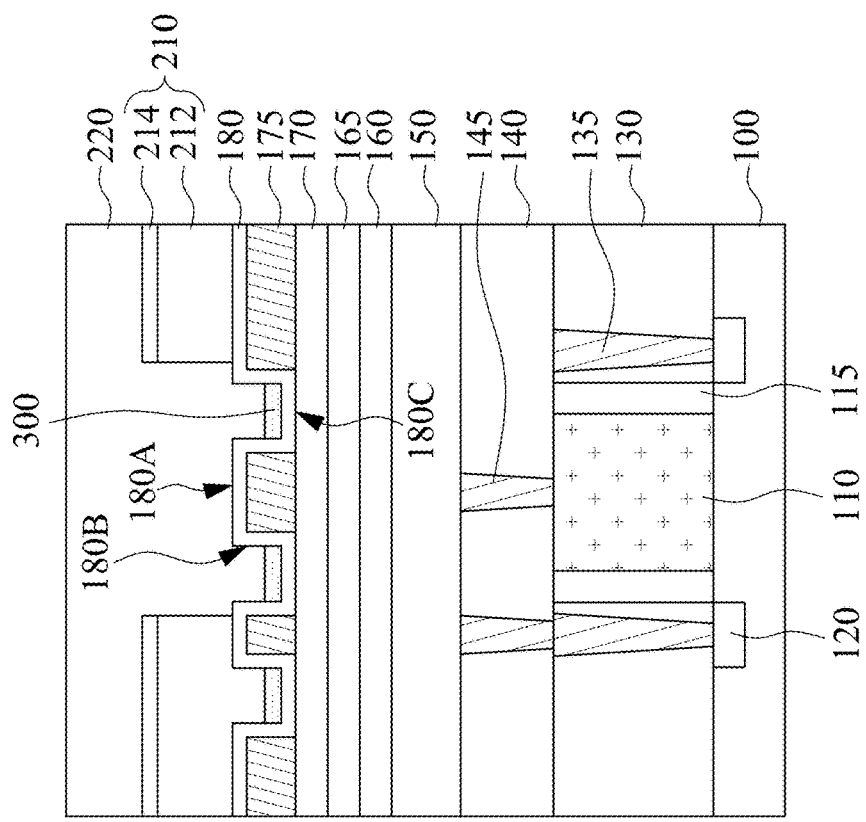
Figure 20A:
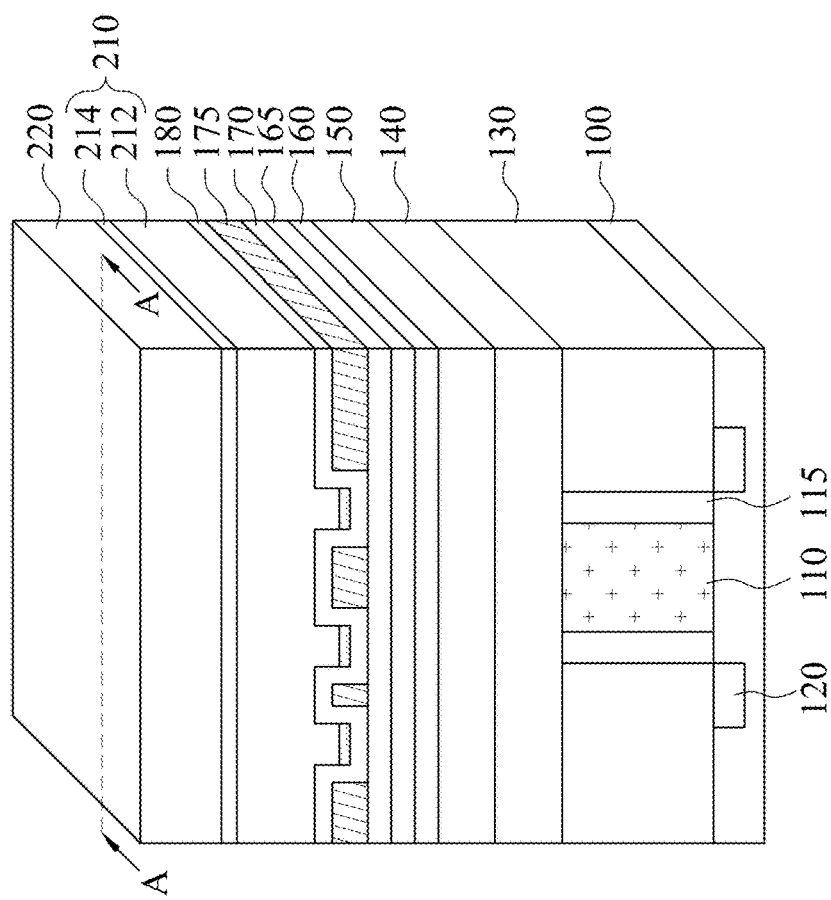

Reference is made to FIGS. 20A and 20B, in which FIG. 20B is a cross-sectional view along line A-A of FIG. 20A. A hard mask layer 220 is formed over the photoresist 210 and filling the openings O1 of the photoresist 210. Accordingly, the hard mask layer 220 may be formed in contact with the first spacer layer 180 and the second spacer layer 300. In greater details, the hard mask layer 220 may be in contact with the first horizontal portions 180A of the first spacer layer 180, the upper parts of the vertical portions 180B of the first spacer layer 180, and the top surface of the second spacer layer 300. In some embodiments, the second horizontal portions 180C of the first spacer layer 180 are separated from the hard mask layer 220 by the second spacer layer 300.

Reference is made to FIGS. 21A and 21B, in which FIG. 21B is a cross-sectional view along line A-A of FIG. 21A. The hard mask layer 220 (see FIGS. 20A and 20B) is etched back to lower a top surface of the hard mask layer 220 to form a plurality of hard masks 230. In some embodiments, the top surface of the hard mask layer 220 may be lowered to a position that is below a topmost position of the first horizontal portions 180A of the first spacer layer 180. In some embodiments, the top surfaces of the hard masks 230 may be lower than the topmost position of the first spacer layer 180, while higher than the topmost position of the second spacer layer 300. In some other embodiments, the top surface of the hard mask layer 220 may be lowered to a position that is substantially level with the topmost position of the first spacer layer 180.

Figure 22B:
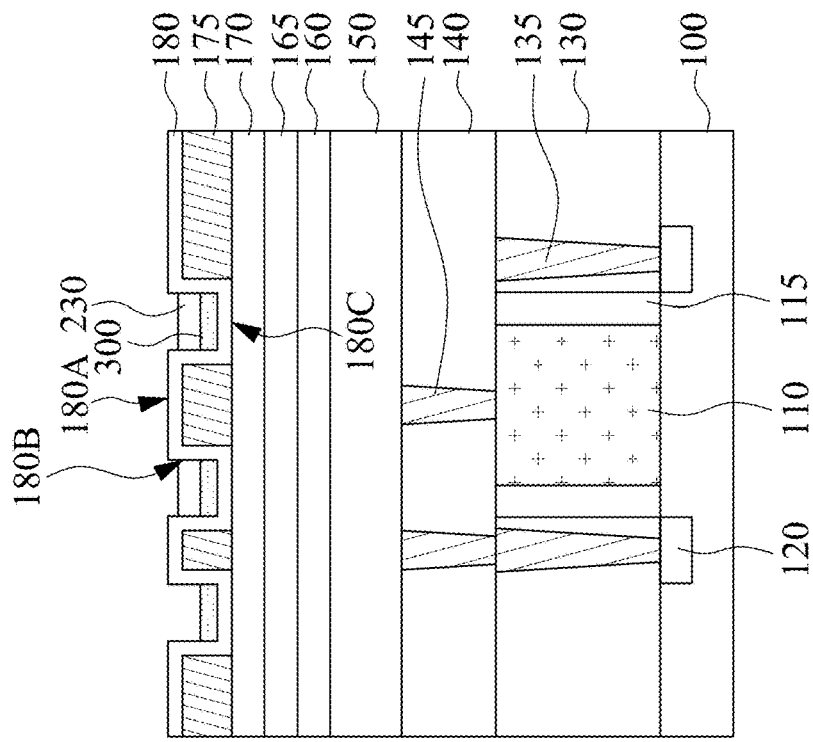
Figure 22A:
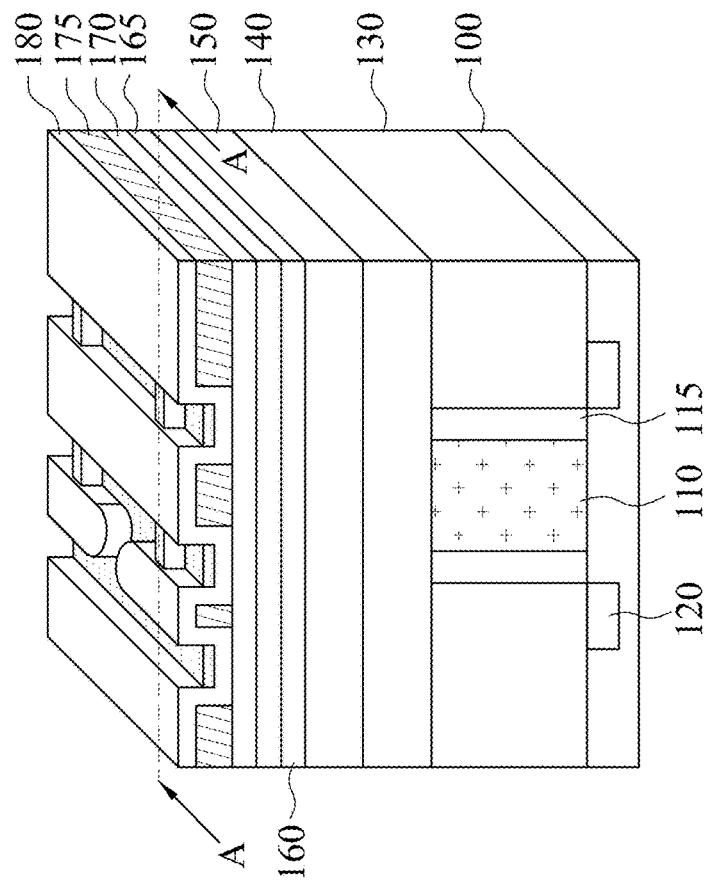

Reference is made to FIGS. 22A and 22B, in which FIG. 22B is a cross-sectional view along line A-A of FIG. 22A. The photoresist 210 is removed. In some embodiments, the photoresist 210 may be removed by suitable process, such as etching.

Reference is made to FIGS. 23A and 23B, in which FIG. 23B is a cross-sectional view along line A-A of FIG. 23A. An anisotropic etching process is performed to remove the first horizontal portions 180A and the second horizontal portions 180C of the first spacer layer 180 to form a plurality of spacers 185, in which the spacers 185 includes the remaining portions of the first spacer layer 180. In some embodiments, the spacers 185 include vertical portions 185B along sidewalls of the amorphous silicon layer 175. After the anisotropic etching process, because the first horizontal portions 180A and the second horizontal portions 180C of the first spacer layer 180 are removed, the top surfaces of the amorphous silicon layer 175 are exposed, and portions of the TEO layer 170 are exposed. In some embodiments, after the anisotropic etching process, the top surfaces of the hard masks 230 may be substantially level with top surfaces of the spacers 185.

Moreover, during the anisotropic etching process, the hard masks 230 can act as a protective layer to protect the underlying second spacer layer 300 and the second horizontal portions 180C of the first spacer layer 180. Accordingly, parts of the second horizontal portions 180C of the first spacer layer 180 that are under and protected by the hard masks 230 may remain after the anisotropic etching process. As a result, the spacers 185 may also include the horizontal portions 185C that are vertically below the hard masks 230 and the second spacer layer 300. Stated another way, the second spacer layer 300 is between the horizontal portions 185C of the spacers 185 and the hard masks 230.

Figure 24B:
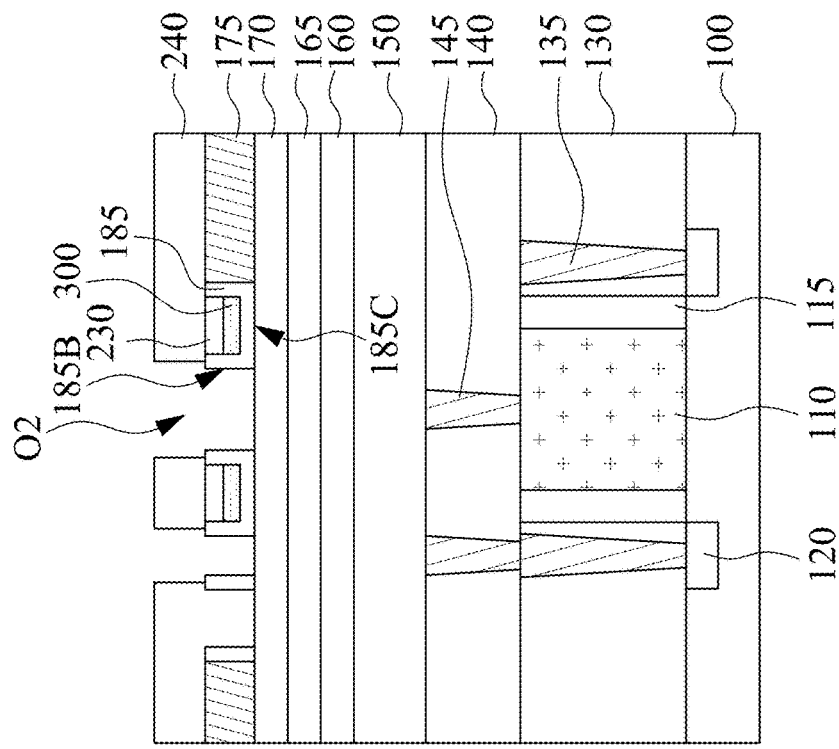
Figure 24A:
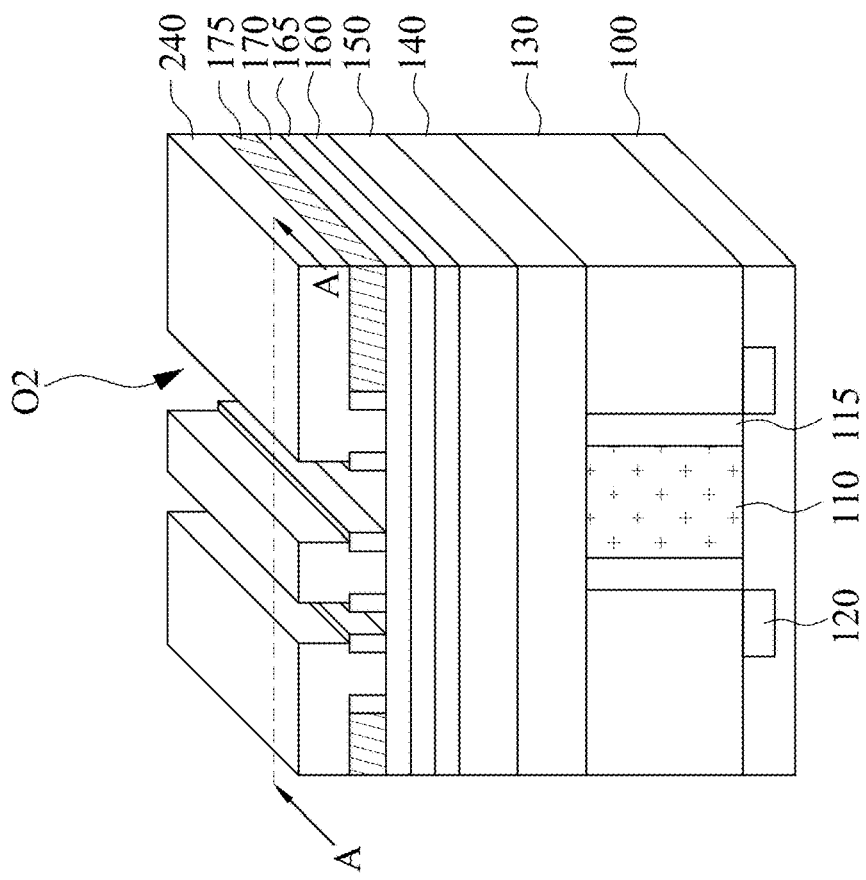

Reference is made to FIGS. 24A and 24B, in which FIG. 24B is a cross-sectional view along line A-A of FIG. 24A. A photoresist 240 is formed over the substrate 100. In some embodiments, the photoresist 240 may include openings O2 that expose portions of the amorphous silicon layer 175 (see FIGS. 23A and 23B). Next, an etching process is performed to remove the portions of the amorphous silicon layer 175 that are exposed by the openings O2 of the photoresist 240. Accordingly, after the portions of the amorphous silicon layer 175 are removed, portions of the TEOS layer 170 are exposed.

Figure 25B:
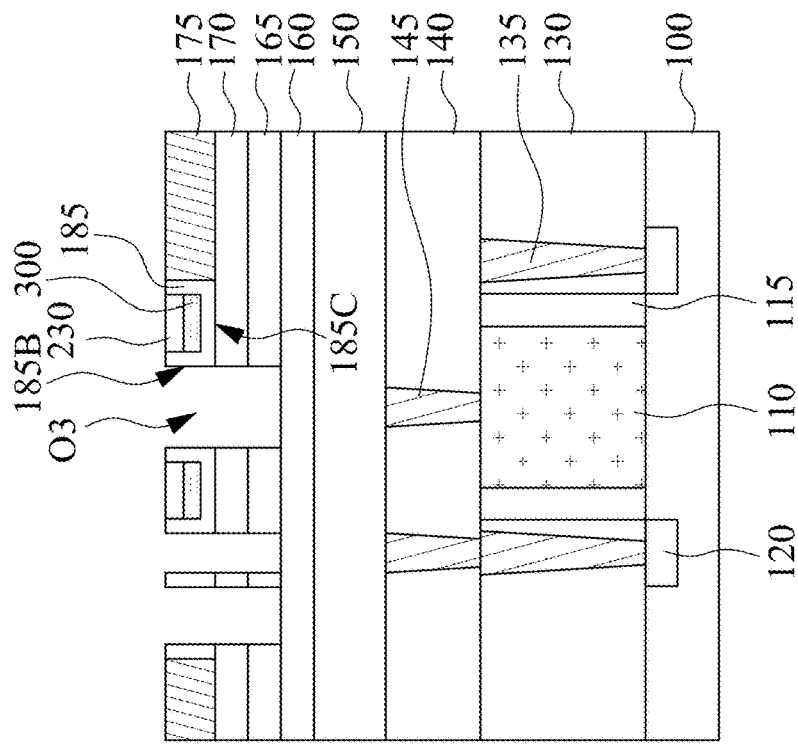
Figure 25A:
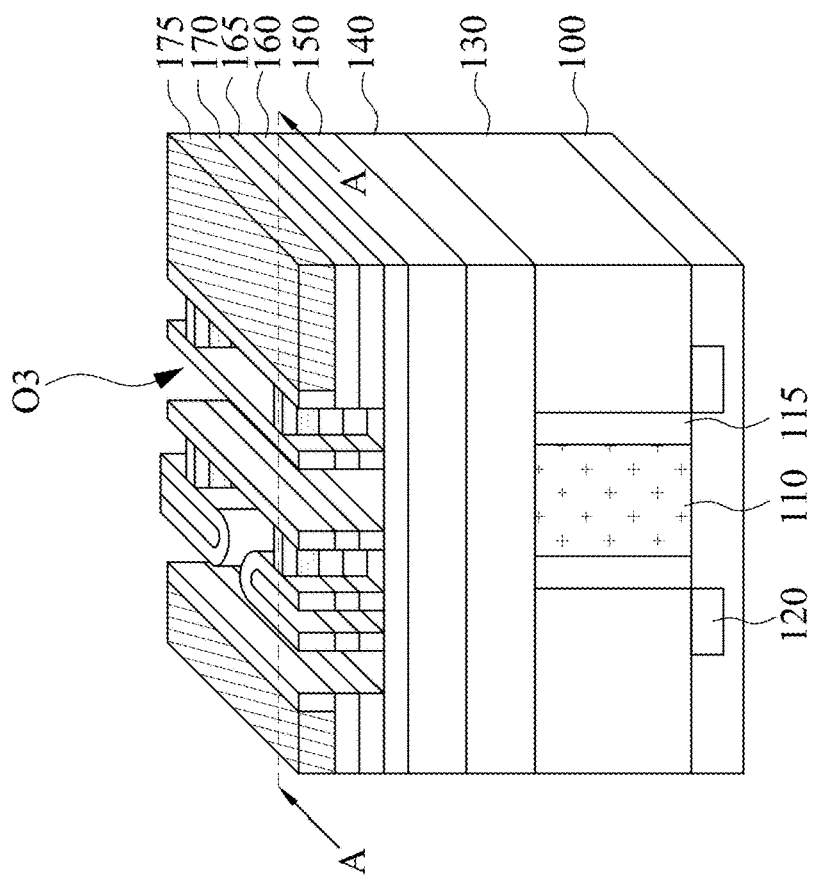

Reference is made to FIGS. 25A and 25B, in which 25B is a cross-sectional view along line A-A of FIG. 25A. The photoresist 240 is removed. Next, an etching process is performed, by using the remaining portions of the amorphous silicon layer 175, the spacers 185, and the hard masks 230 as etch mask, to pattern the TEOS layer 170 and the titanium nitride layer 165. After the etching process, the patterned TEOS layer 170 and the patterned titanium nitride layer 165 may include openings O3 that expose the ARC 160.

Figure 26B:
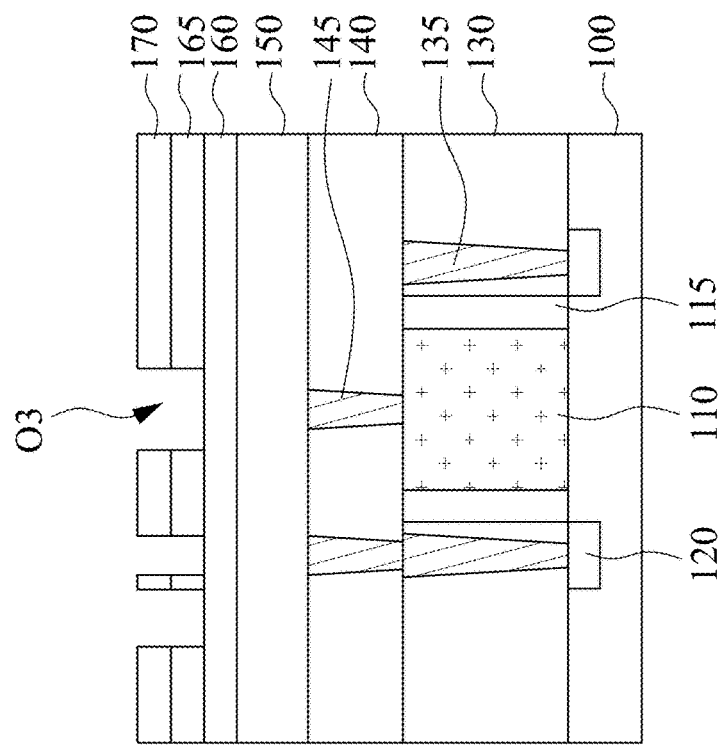
Figure 26A:
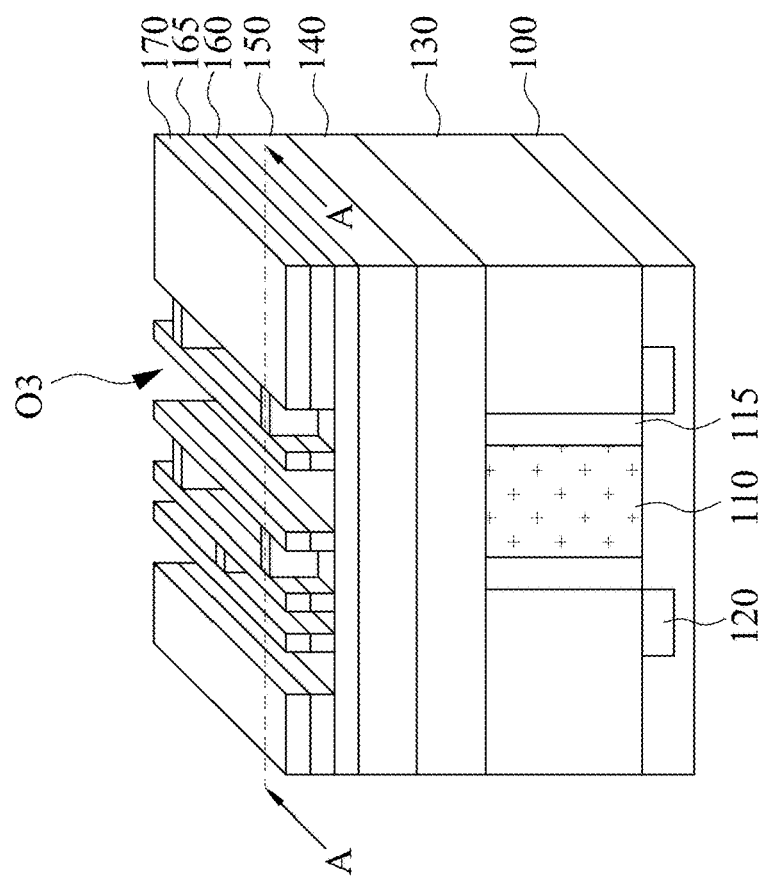

Reference is made to FIGS. 26A and 26B, in which FIG. 26B is a cross-sectional view along line A-A of FIG. 26A. The remaining portions of the amorphous silicon layer 175, the spacers 185, and the hard masks 230 are removed. In some embodiments, the amorphous silicon layer 175, the composite spacers 205, and the hard masks 230 may be removed by suitable etching process, such as dry etch, wet etch, or combinations thereof.

It is noted that the structure shown in FIGS. 26A and 26B may further undergo the processes discussed in FIGS. 14A to 16B, wherein the ILD layer 150 is patterned to form trenches extending in the ILD layer 150, and then metal lines 250 are formed in the trenches in the ILD layer 150. The resultant structure is exemplarily illustrated in FIGS. 16A and 16B. Relevant details will not be repeated for simplicity.

FIGS. 27A to 35B show various stages of a sequential manufacturing operation of a semiconductor device according to an embodiment of the present disclosure. Some elements of FIGS. 27A to 35B are similar to those described in FIGS. 1A to 16B, such elements are labeled the same, and relevant details will not be repeated for simplicity. It is understood that additional operations can be provided before, during, and after the processes shown by FIGS. 27A to 35B, and some of the operations described below can be replaced or eliminated, for additional embodiments of the method. Material, configuration, dimensions and/or processes the same as or similar to the foregoing embodiments described with FIGS. 27A to 35B may be employed in the following embodiments, and detailed explanation thereof may be omitted.

Figure 27B:
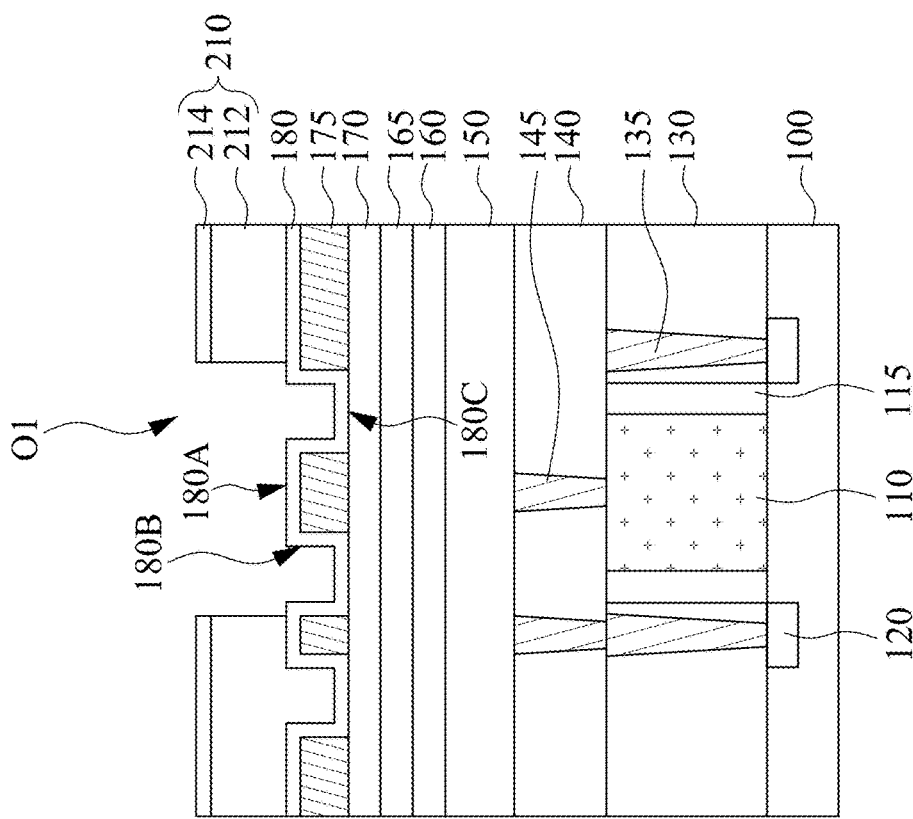
Figure 27A:
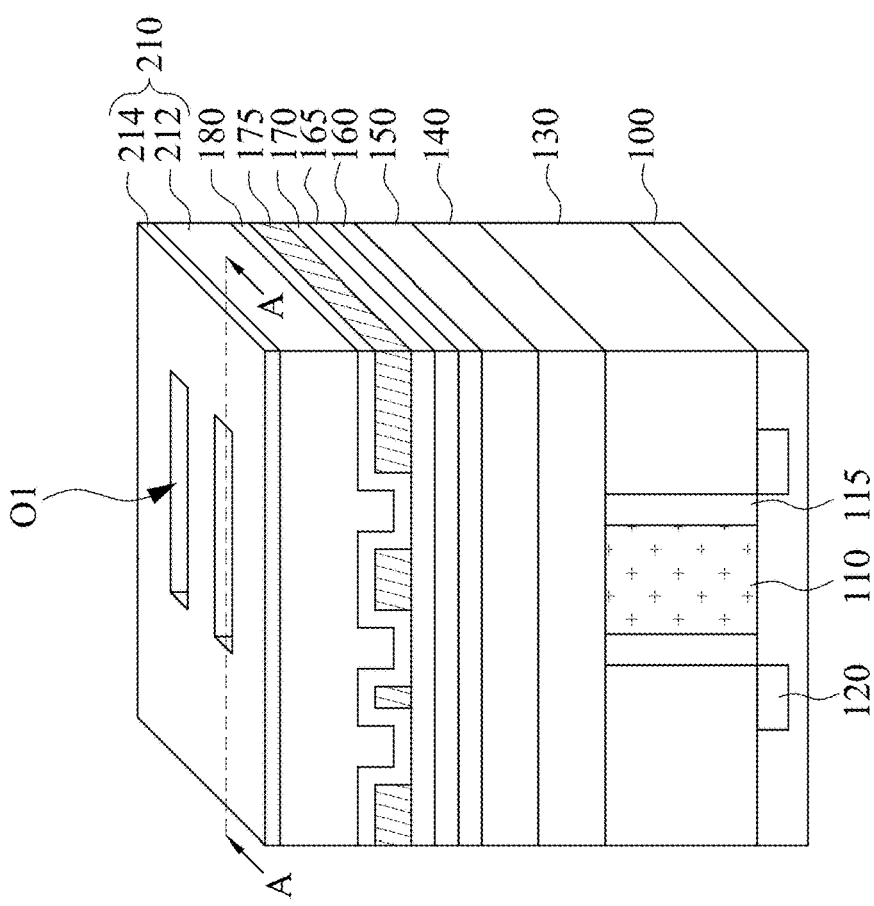

Reference is made to FIGS. 27A and 27B, in which FIG. 27B is a cross-sectional view along line A-A of FIG. 27A. FIGS. 27A and 27B illustrates an intermediate stage following the step shown in FIGS. 2A and 2B, wherein a photoresist 210, which includes a bottom layer (BL) 212 and a middle layer (ML) 214, has been formed over the first spacer layer 180. In some embodiments, the photoresist 210 is patterned to form openings O1 that expose portions of the first spacer layer 180.

Reference is made to FIGS. 28A and 28B, in which FIG. 28B is a cross-sectional view along line A-A of FIG. 28A. A second spacer layer 350 is formed in the openings O1 of the photoresist 210 and over the exposed portions of the first spacer layer 180. In some embodiments, the second spacer layer 350 is formed over the exposed portions of the first spacer layer 180 via a bottom-up manner. That is, the deposition rate of the second spacer layer 350 is higher on the surfaces of the first spacer layer 180 than on the surfaces of the photoresist 210. In some embodiments, the bottom-up deposition may be achieved by, for example, treating the first spacer layer 180 to increase deposition rate of a material of the second spacer layer 350 on the treated first spacer layer 180 and/or treating the photoresist 210 to reduce the deposition rate of a material of the second spacer layer 350 on the treated photoresist 350. In some other embodiments, the second spacer layer 350 may be formed by, for example, depositing a conformal layer of second spacer material over the structure shown in FIGS. 27A and 27B, followed by a directional etching process performed using directional ions directed toward the substrate 100 at tilt angles. Accordingly, in some embodiments, the second spacer layer 350 may only cover the exposed portions of the first spacer layer 180, while the surfaces of the photoresist 210 may be free from coverage by the second spacer layer 350. In some embodiments, the first spacer layer 180 and the second spacer layer 350 can also be collectively referred to as a composite spacer.

In some embodiments, the first spacer layer 180 may include first horizontal portions 180A horizontally extending along top surfaces of the amorphous silicon layer 175, vertical portions 180B vertically extending along sidewalls of the amorphous silicon layer 175, and second horizontal portions 180C horizontally extending along top surfaces of the TEOS layer 170. In some embodiments, the second spacer layer 350 may covers the first horizontal portions 180A, the vertical portions 180B, and the second horizontal portions 180C of the first spacer layer 180 that are exposed by the openings O1 of the photoresist 210.

Figure 29B:
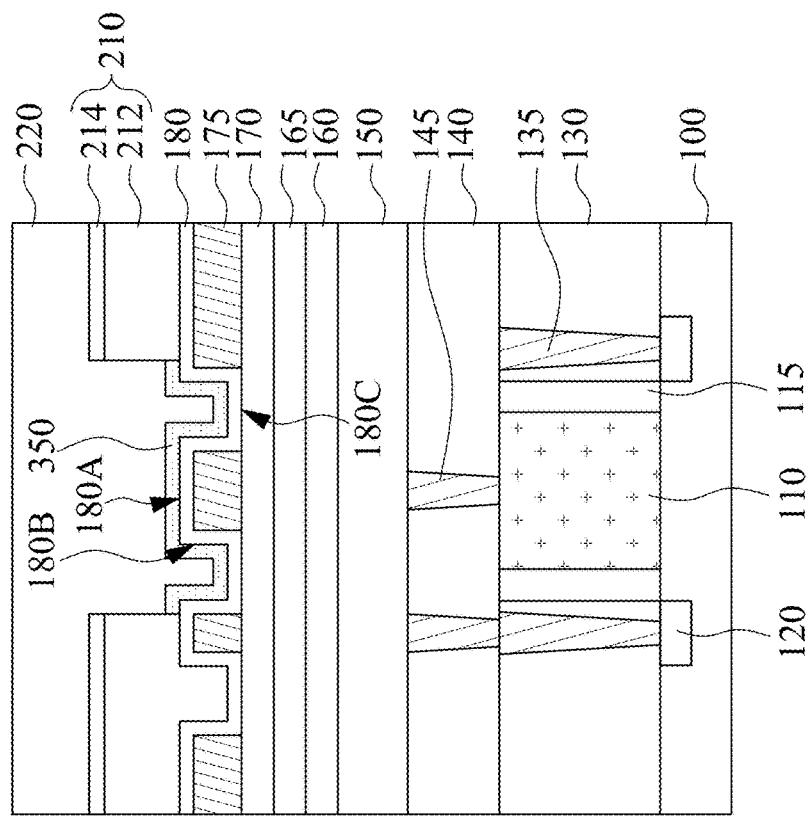
Figure 29A:
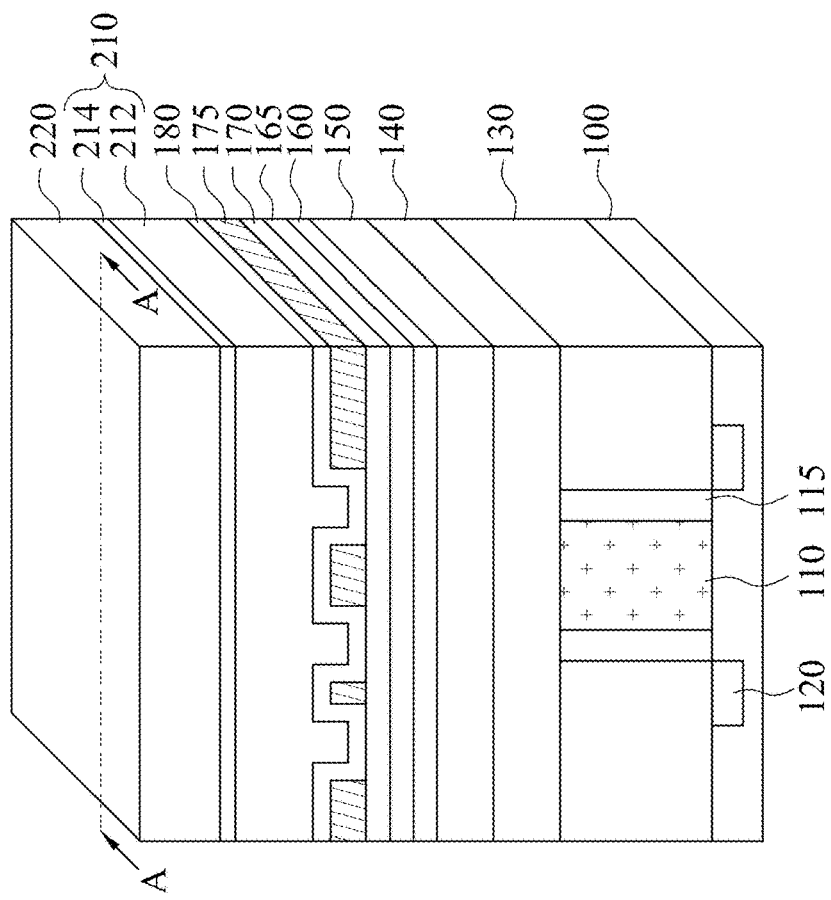

Reference is made to FIGS. 29A and 29B, in which FIG. 29B is a cross-sectional view along line A-A of FIG. 29A. A hard mask layer 220 is formed over the middle layer 214 and filling the openings O1 of the photoresist 210. Accordingly, the hard mask layer 220 may be formed in contact with the second spacer layer 350. In some embodiments, the first spacer layer 180 is separated from the hard mask layer 220 by the second spacer layer 350.

Figure 30B:
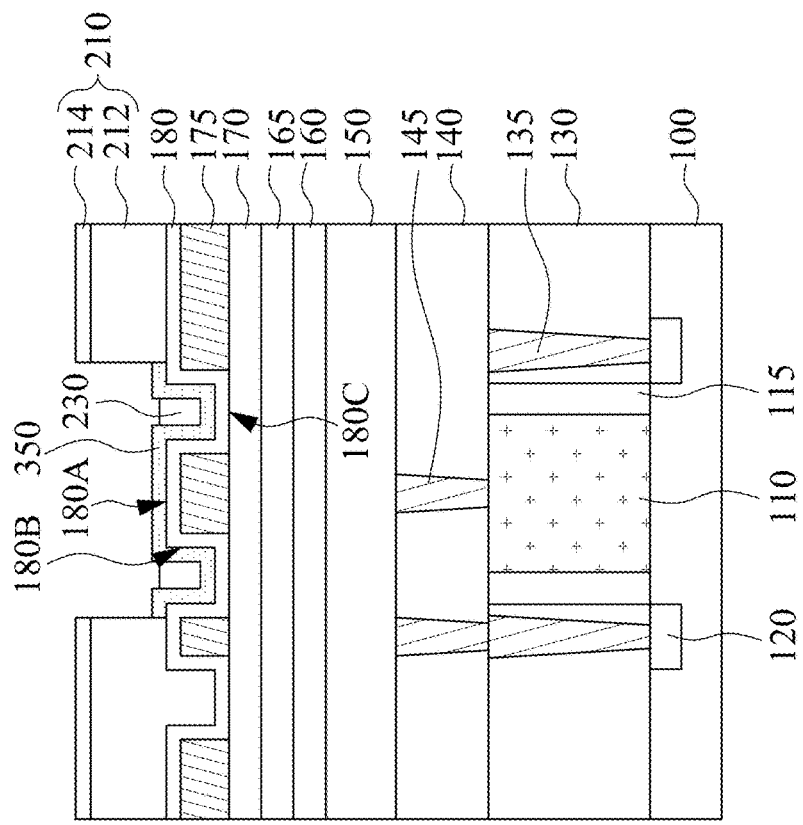
Figure 30A:
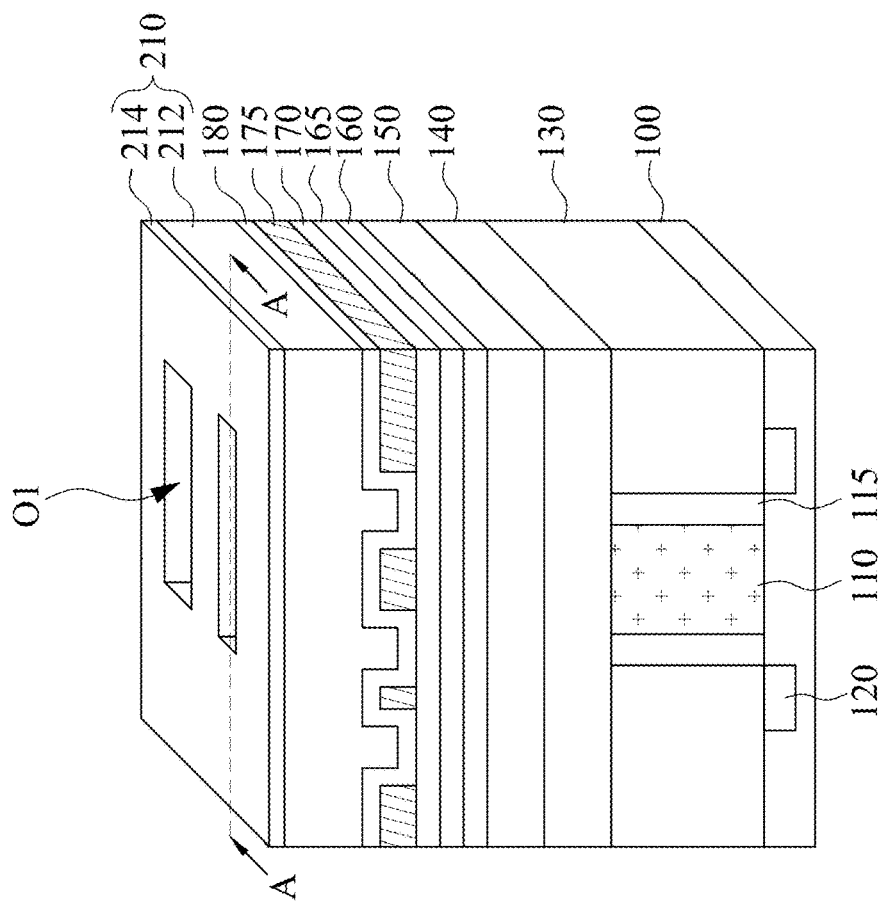

Reference is made to FIGS. 30A and 30B, in which FIG. 30B is a cross-sectional view along line A-A of FIG. 30A. The hard mask layer 220 (see FIGS. 29A and 29B) is etched back to lower a top surface of the hard mask layer 220 to form a plurality of hard masks 230. In some embodiments, the top surface of the hard mask layer 220 may be lowered to a position that is below a topmost position of the second spacer layer 350. In some embodiments, the top surfaces of the hard masks 230 may be lower than the topmost position of the second spacer layer 350, and may be higher than the topmost position of the first spacer layer 180. In some other embodiments, the top surface of the hard mask layer 220 may be lowered to a position that is substantially level with the topmost position of the second spacer layer 350 of the composite spacer layer 200.

Figure 31B:
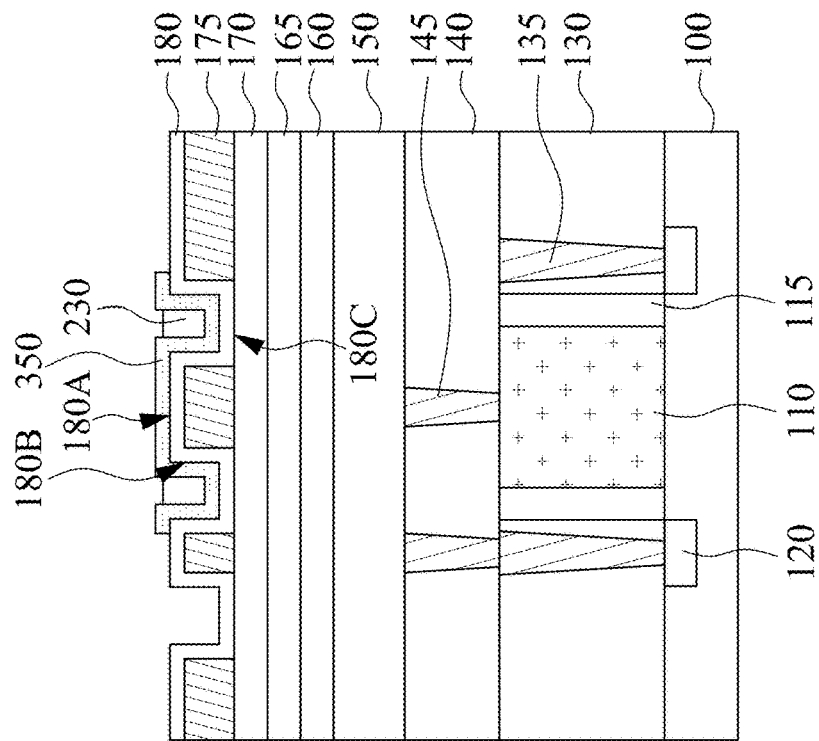
Figure 31A:
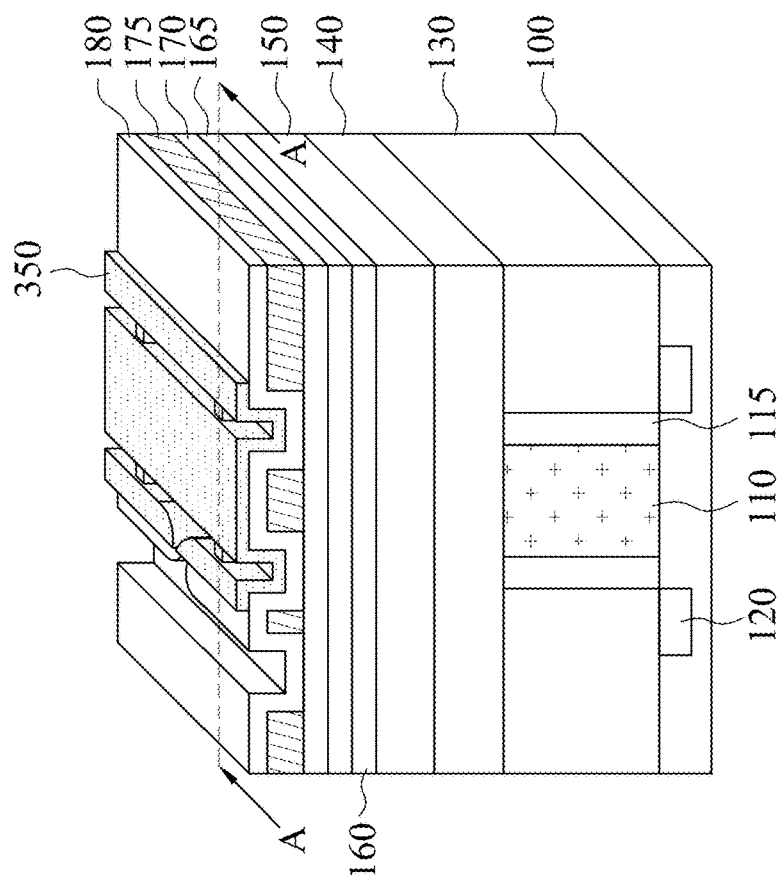

Reference is made to FIGS. 31A and 31B, in which FIG. 31B is a cross-sectional view along line A-A of FIG. 31A. The photoresist 210 is removed. In some embodiments, the photoresist 210 may be removed by suitable process, such as etching.

Figure 32B:
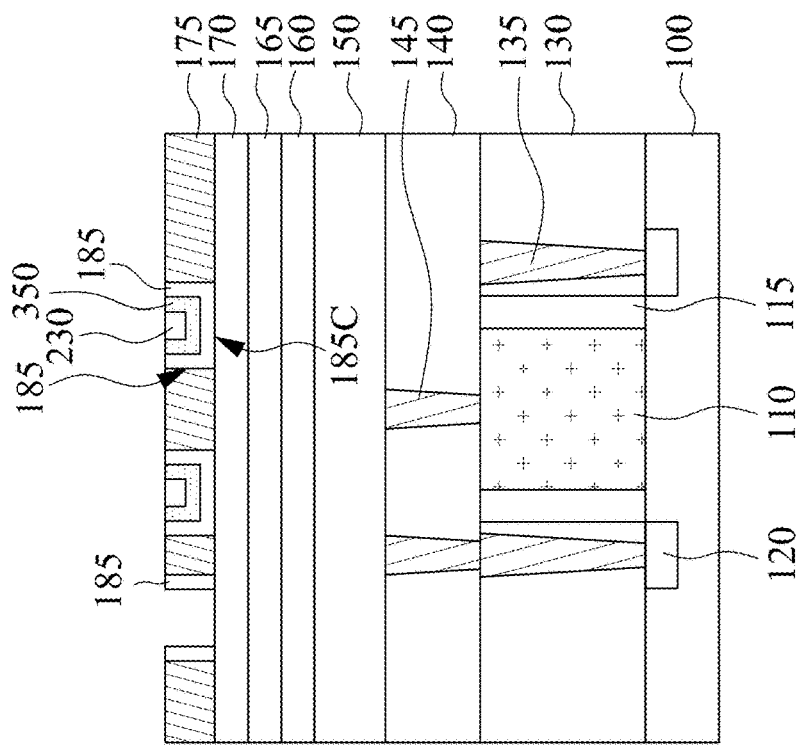
Figure 32A:
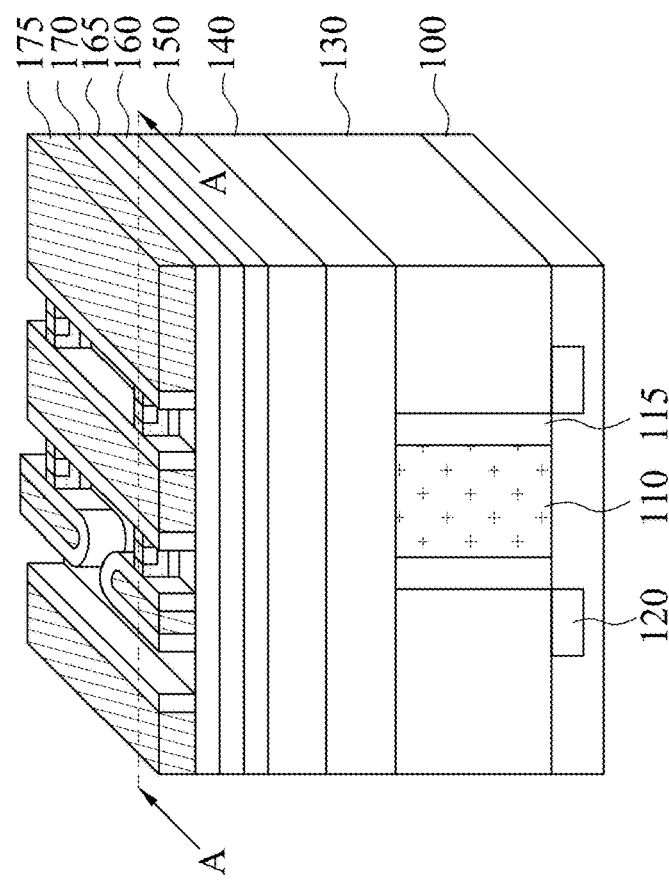

Reference is made to FIGS. 32A and 32B, in which FIG. 32B is a cross-sectional view along line A-A of FIG. 32A. An anisotropic etching process is performed to remove the first horizontal portions 180A and the second horizontal portions 180C of the first spacer layer 180 to form a plurality of spacers 185, in which the spacers 185 includes the remaining portions of the first spacer layer 180. In some embodiments, the spacers 185 include vertical portions 185B along sidewalls of the amorphous silicon layer 175. After the anisotropic etching process, because the first horizontal portions 180A and the second horizontal portions 180C of the first spacer layer 180 are removed, the top surfaces of the amorphous silicon layer 175 are exposed, and portions of the TEOS layer 170 are exposed. In some embodiments, after the anisotropic etching process, the top surfaces of the hard masks 230 may be substantially level with top surfaces of the spacers 185 and the second spacer layer 350.

Moreover, during the anisotropic etching process, the hard masks 230 and the second spacer layer 350 can act as a protective layer to protect the underlying second horizontal portions 180C of the first spacer layer 180. Accordingly, parts of the second horizontal portions 180C of the first spacer layer 180 that are under and protected by the hard masks 230 may remain after the anisotropic etching process. As a result, the spacers 185 may also include the horizontal portions 185C that are vertically below the hard masks 230 and the second spacer layer 350. Stated another way, the second spacer layer 300 is between the horizontal portions 185C of the spacers 185 and the hard masks 230. In some embodiments, the top surfaces of the second spacer layer 350 are exposed by the spacers 185 and the hard masks 230.

Figure 33B:
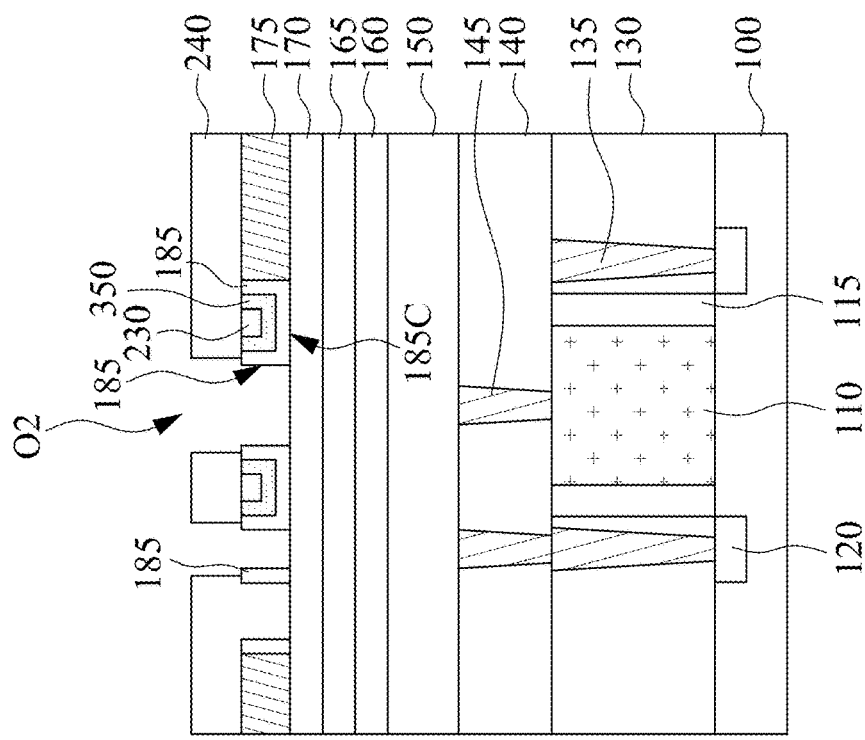
Figure 33A:
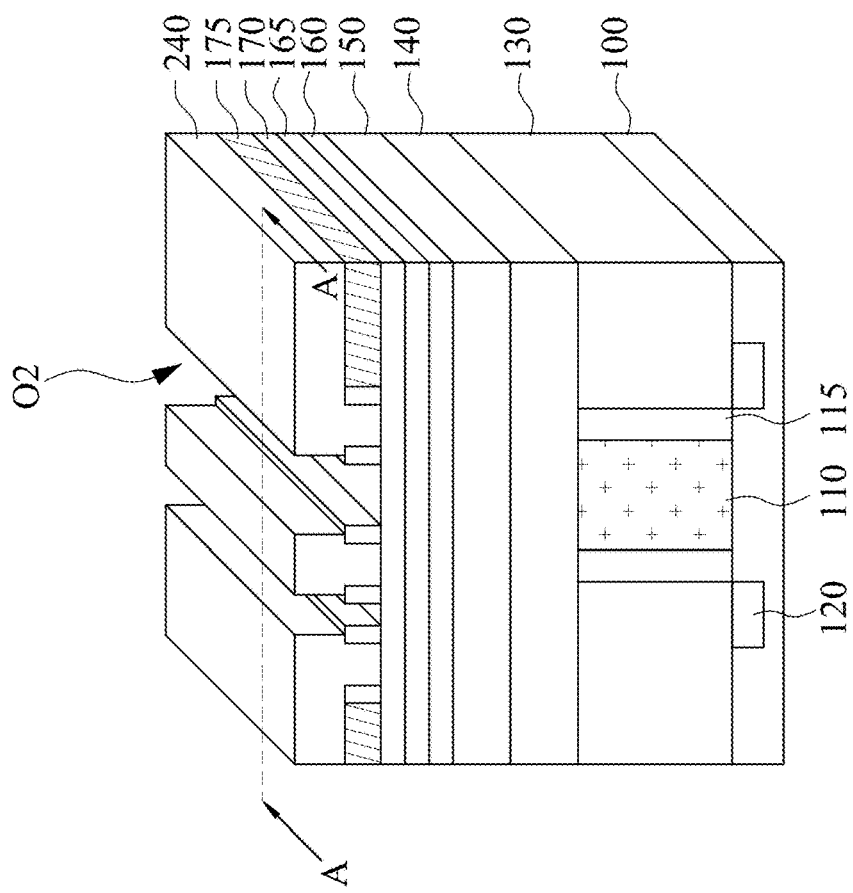

Reference is made to FIGS. 33A and 33B, in which 33B is a cross-sectional view along line A-A of FIG. 33A. A photoresist 240 is formed over the substrate 100. In some embodiments, the photoresist 240 may include openings O2 that expose portions of the amorphous silicon layer 175 (see FIGS. 32A and 32B). Next, an etching process is performed to remove the portions of the amorphous silicon layer 175 that are exposed by the openings O2 of the photoresist 240. Accordingly, after the portions of the amorphous silicon layer 175 are removed, portions of the TEOS layer 170 are exposed.

Figure 34B:
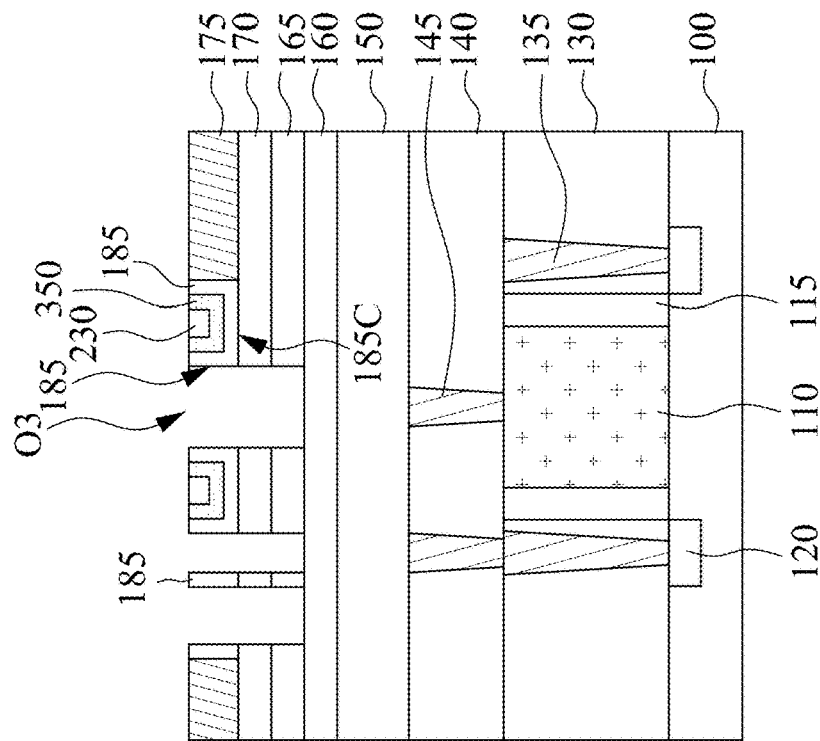
Figure 34A:
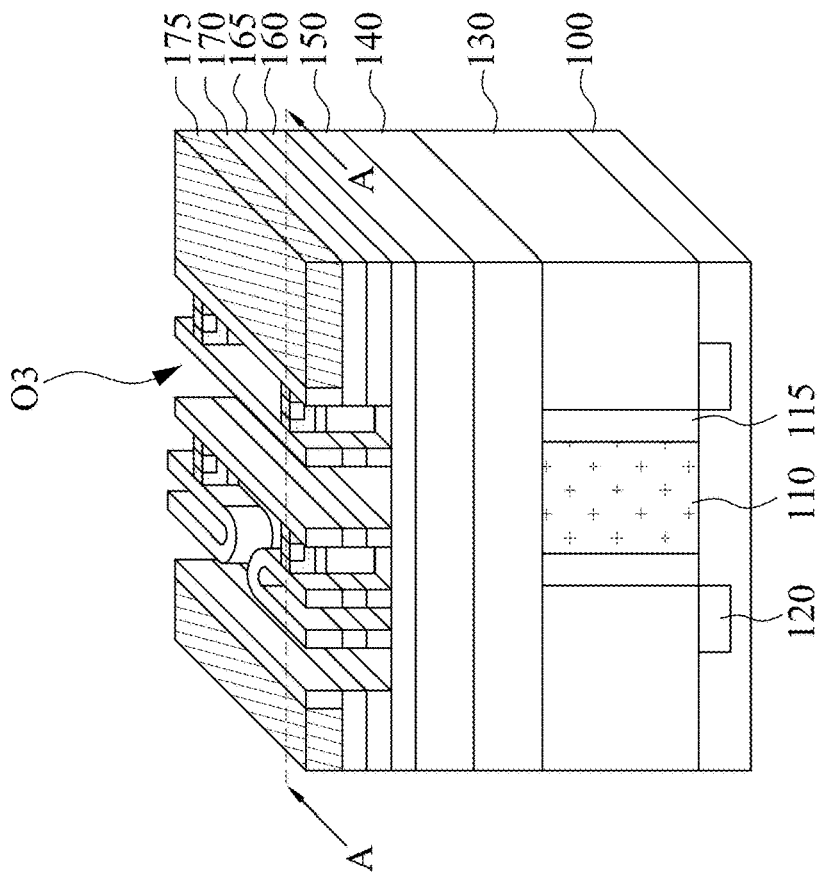

Reference is made to FIGS. 34A and 34B, in which FIG. 34B is a cross-sectional view along line A-A of FIG. 34A. The photoresist 240 is removed. Next, an etching process is performed, by using the remaining portions of the amorphous silicon layer 175, the spacers 185, the second spacer layer 350, and the hard masks 230 as etch mask, to pattern the TEOS layer 170 and the titanium nitride layer 165. After the etching process, the patterned TEOS layer 170 and the patterned titanium nitride layer 165 may include openings O3 that expose the ARC 160.

Figure 35B:
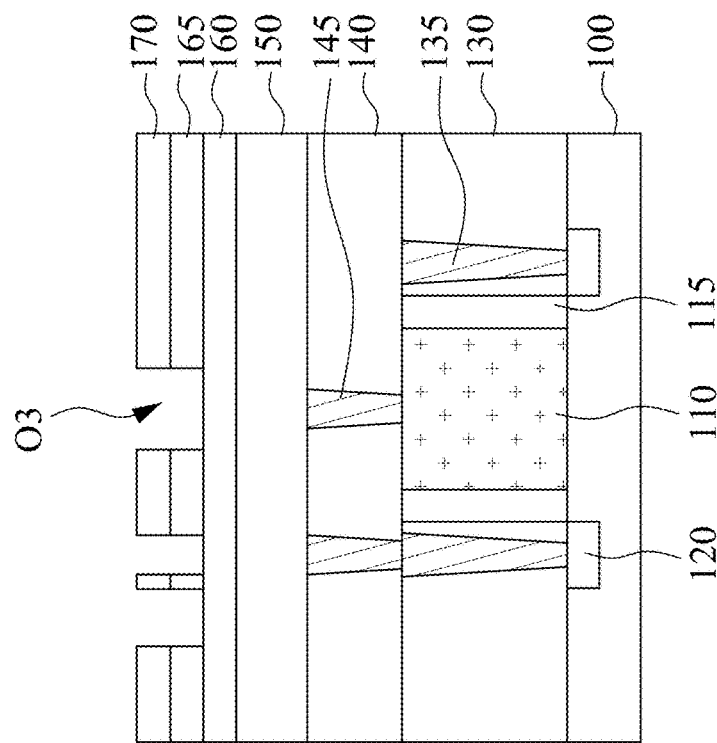
Figure 35A:
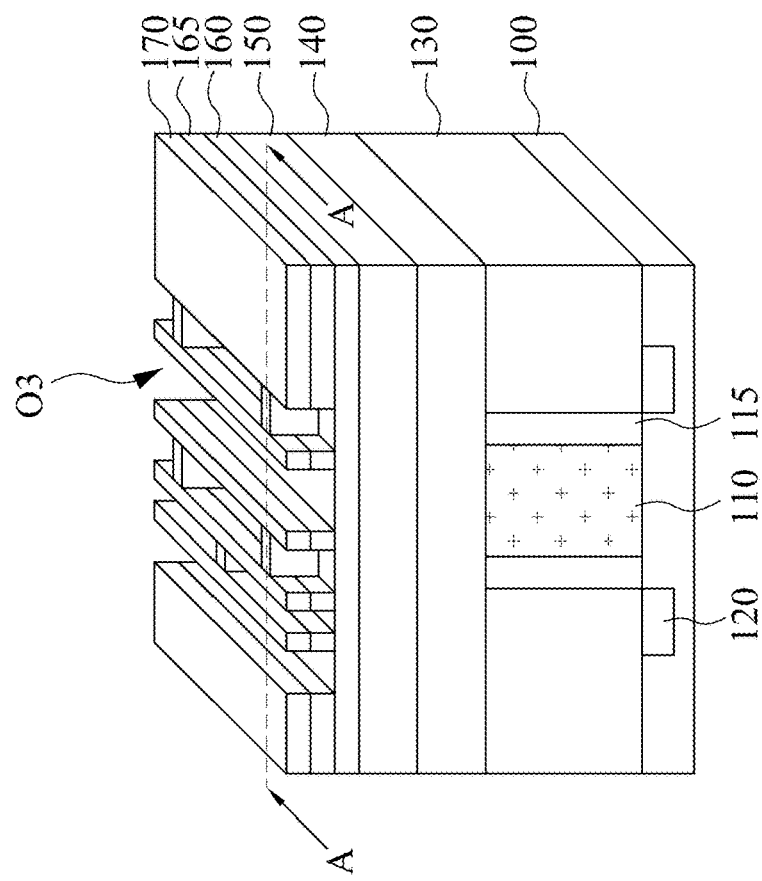

Reference is made to FIGS. 35A and 35B, in which FIG. 35B is a cross-sectional view along line A-A of FIG. 35A. The remaining portions of the amorphous silicon layer 175, the spacers 185, the second spacer layer 350, and the hard masks 230 are removed. In some embodiments, the amorphous silicon layer 175, the composite spacers 205, and the hard masks 230 may be removed by suitable etching process, such as dry etch, wet etch, or combinations thereof.

It is noted that the structure shown in FIGS. 35A and 35B may further undergo the processes discussed in FIGS. 14A to 14B, wherein the ILD layer 150 is patterned to form trenches extending in the ILD layer 150, and then the metal lines 250 are formed in the trenches in the ILD layer 150. The resultant structure is exemplarily illustrated in FIGS. 16A and 16B. Relevant details will not be repeated for simplicity.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that a bi-layer spacer is used as an etch mask during an etching process. For example, the bi-layer spacer may include a first spacer layer and a second spacer layer over the first spacer layer. Next, a hard mask is formed over the second spacer layer of the bi-layer spacer. The second spacer layer of bi-layer spacer has better crystalline quality than the first spacer layer of the bi-layer spacer. Accordingly, the second spacer layer and the hard mask may provide sufficient etching selectivity during the etching process. In some embodiments, the hard mask may be consumed during the etching process and may not have enough height as an etch mask. However, the second spacer layer, which has etching selectivity to the hard mask, may provide sufficient etching resistance to the etching process, and thus will reduce process defect at smaller line width and critical dimension. Accordingly, the process reliability and the device performance may be improved.

In some embodiments of the present disclosure, a method includes forming a dielectric layer over a substrate; forming a patterned amorphous silicon layer over a dielectric layer; depositing a first spacer layer over the patterned amorphous silicon layer; depositing a second spacer layer over the first spacer layer; forming a photoresist having an opening over the substrate; depositing a hard mask layer in the opening of the photoresist; after depositing the hard mask layer in the opening of the photoresist, removing the photoresist; and performing an etching process to etch the dielectric layer by using the patterned amorphous silicon layer, the first spacer layer, the second spacer layer, and the hard mask layer as an etch mask, wherein the etching process etches the second spacer layer at a slower etch rate than etching the first spacer layer. In some embodiments, the method further includes after removing the photoresist and prior to etching the dielectric layer, performing an anisotropic etching process to remove first horizontal portions of the first spacer layer and the second spacer layer, while leaving second horizontal portions of the first spacer layer and the second spacer layer under the hard mask layer. In some embodiments, the method further includes etching back the hard mask layer to lower a top surface of the hard mask layer to a position lower than a top surface of the second spacer layer. In some embodiments, wherein depositing the second spacer layer is performed after forming the photoresist, and the second spacer layer is deposited in the opening of the photoresist. In some embodiments, wherein the photoresist is formed after depositing the second spacer layer over the first spacer layer. In some embodiments, wherein after removing the photoresist, a first portion of the first spacer layer is exposed and a second portion of the first spacer layer is covered by the second spacer layer. In some embodiments, the method further includes etching back the second spacer layer prior to forming the photoresist. In some embodiments, wherein etching back the second spacer layer is performed until a top surface of the first spacer layer is exposed. In some embodiments, wherein depositing the hard mask layer is performed after etching back the second spacer layer, such that the hard mask layer is in contact with the first spacer layer.

In some embodiments of the present disclosure, a method includes forming a dielectric layer over a substrate; forming a patterned amorphous silicon layer over a dielectric layer; depositing a first spacer layer over the patterned amorphous silicon layer; depositing a second spacer layer over the first spacer layer to form a bilayer spacer film including the first spacer layer and the second spacer layer; forming a hard mask covering a first horizontal portion of the bilayer spacer film; performing an etching process to remove a second horizontal portion of the bilayer spacer film not covered by the hard mask, wherein the first horizontal portion of the bilayer spacer film and a vertical portion of the bilayer spacer film along a sidewall of the patterned amorphous silicon layer remain after the etching process is complete; and etching the dielectric layer by using the remaining first horizontal portion and vertical portion of the bilayer spacer film and the hard mask as an etch mask. In some embodiments, wherein forming the hard mask comprises forming a photoresist having an opening over the second spacer layer; depositing a hard mask layer in the opening in the photoresist; and etching back the hard mask layer until the hard mask layer falls below a topmost position of the first spacer layer. In some embodiments, the method further includes after performing the etching process to remove the second horizontal portion of the bilayer spacer film, forming a photoresist having an opening exposing a portion of the patterned amorphous silicon layer; and etching the exposed portion of the patterned amorphous silicon layer. In some embodiments, wherein the hard mask is separated from the first spacer layer by the second spacer layer. In some embodiments, wherein the second spacer layer is in contact with sidewalls and a bottom surface of the hard mask. In some embodiments, the method further includes etching back the second spacer layer prior to forming the hard mask.

In some embodiments, wherein the hard mask is in contact with the first spacer layer and the second spacer layer.

In some embodiments of the present disclosure, a method includes forming a dielectric layer over a substrate; forming a patterned amorphous silicon layer over a dielectric layer; depositing a first spacer layer over the patterned amorphous silicon layer; forming a photoresist having an opening exposing a portion of the first spacer layer; depositing a second spacer layer in the opening of the photoresist and over the first spacer layer; forming a hard mask layer in the opening of the photoresist and over second spacer layer; after forming the hard mask in the opening of the photoresist, removing the photoresist; and etching the dielectric layer by using the first spacer layer, the second spacer layer, and the hard mask layer as an etch mask. In some embodiments, the method further includes etching horizontal portions of the first spacer layer that are exposed by the hard mask after removing the photoresist and prior to etching the dielectric layer. In some embodiments, wherein the hard mask layer is in contact with a sidewall of the photoresist. In some embodiments, wherein the first spacer layer is deposited using a plasma-free atomic layer deposition (ALD), and the second spacer layer is deposited using a plasma-enhanced ALD process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric layer over a substrate;
    forming a patterned amorphous silicon layer over the dielectric layer;
    depositing a first spacer layer over the patterned amorphous silicon layer;
    depositing a second spacer layer over the first spacer layer;
    forming a photoresist having an opening over the substrate;
    depositing a hard mask layer in the opening of the photoresist;
    etching back the hard mask layer to lower a top surface of the hard mask layer to a position lower than a top surface of the second spacer layer;
    after depositing the hard mask layer in the opening of the photoresist, removing the photoresist; and
    performing an etching process to etch the dielectric layer by using the patterned amorphous silicon layer, the first spacer layer, the second spacer layer, and the hard mask layer as an etch mask, wherein the etching process etches the second spacer layer at a slower etch rate than etching the first spacer layer.

2. The method of claim 1, further comprising:
    after removing the photoresist and prior to etching the dielectric layer, performing an anisotropic etching process to remove first horizontal portions of the first spacer layer and the second spacer layer, while leaving second horizontal portions of the first spacer layer and the second spacer layer under the hard mask layer.

3. The method of claim 1, wherein the photoresist is formed after depositing the second spacer layer over the first spacer layer.

4. The method of claim 1, wherein the first spacer layer and the second spacer layer are made of titanium oxide.

5. The method of claim 1, wherein the first spacer layer is deposited using a plasma-free deposition process, while the second spacer layer is deposited using plasma-treatment, and the first spacer layer and the second spacer layer are made of a same material.

6. A method, comprising:
    forming a dielectric layer over a substrate;
    forming a patterned amorphous silicon layer over the dielectric layer;
    depositing a first spacer layer over the patterned amorphous silicon layer;
    depositing a second spacer layer over the first spacer layer to form a bilayer spacer film including the first spacer layer and the second spacer layer;
    forming a hard mask covering a first horizontal portion of the bilayer spacer film, wherein a top surface of the hard mask is lower than a topmost position of the bilayer spacer film;
    performing an etching process to remove a second horizontal portion of the bilayer spacer film not covered by the hard mask, wherein the first horizontal portion of the bilayer spacer film and a vertical portion of the bilayer spacer film along a sidewall of the patterned amorphous silicon layer remain after the etching process is complete; and
    etching the dielectric layer by using the remaining first horizontal portion and vertical portion of the bilayer spacer film and the hard mask as an etch mask.

7. The method of claim 6, wherein forming the hard mask comprises:
    forming a photoresist having an opening over the second spacer layer;
    depositing a hard mask layer in the opening in the photoresist; and
    etching back the hard mask layer.

8. The method of claim 6, further comprising:
    after performing the etching process to remove the second horizontal portion of the bilayer spacer film, forming a photoresist having an opening exposing a portion of the patterned amorphous silicon layer; and
    etching the exposed portion of the patterned amorphous silicon layer.

9. The method of claim 6, wherein the hard mask is separated from the first spacer layer by the second spacer layer.

10. The method of claim 6, wherein the second spacer layer is in contact with sidewalls and a bottom surface of the hard mask.

11. The method of claim 6, wherein the first spacer layer and the second spacer layer are made of titanium oxide.

12. A method, comprising:
    forming a dielectric layer over a substrate;
    forming a patterned amorphous silicon layer over the dielectric layer;
    depositing a first spacer layer over the patterned amorphous silicon layer;
    depositing a second spacer layer over the first spacer layer, wherein the first spacer layer and the second spacer layer are made of titanium oxide;

forming a hard mask layer over a first portion of the second spacer layer, while leaving a second portion of the second spacer layer uncovered by the hard mask layer; and performing an etching process to etch the dielectric layer by using the patterned amorphous silicon layer, the first spacer layer, the second spacer layer, and the hard mask layer as an etch mask.

13. The method of claim 12, wherein a top surface of the hard mask layer is lower than a top surface of the second spacer layer.

14. The method of claim 12, further comprising:

forming a photoresist having an opening over the second spacer layer, wherein the opening of the photoresist exposes the first portion of the second spacer layer and the photoresist covers the second portion of the second spacer layer, wherein the hard mask layer is formed in the opening of the photoresist; and removing the photoresist after forming the hard mask layer.

15. The method of claim 14, further comprising, prior to removing the photoresist, etching back the hard mask layer to lower a top surface of the hard mask layer.

16. The method of claim 12, wherein an entirety of the hard mask layer is spaced apart from the first spacer layer.

17. The method of claim 12, further comprising, prior to performing the etching process, removing first horizontal portions of the first spacer layer and the second spacer layer that are not covered by the hard mask layer.

18. The method of claim 17, wherein second horizontal portions of the first spacer layer and the second spacer layer under the hard mask layer remain during performing the etching process.

19. The method of claim 12, wherein the first spacer layer is deposited using a plasma-free deposition process, while the second spacer layer is deposited using plasma-treatment.

20. The method of claim 12, wherein the etching process etches the second spacer layer at a slower etch rate than etching the first spacer layer.

* * * * *